United States Patent [19]
Koyanagi et al.

[11] Patent Number: 5,659,512
[45] Date of Patent: Aug. 19, 1997

[54] SEMICONDUCTOR INTEGRATED CIRCUIT APPLICABLE TO DATA READ CIRCUIT FROM MEMORY

[75] Inventors: Masaru Koyanagi, Yokohama; Tsuyoshi Etoh, Kawasaki, both of Japan

[73] Assignee: Kabushiki Kaisha Toshiba, Tokyo, Japan

[21] Appl. No.: 615,364

[22] Filed: Mar. 13, 1996

Related U.S. Application Data

[63] Continuation of Ser. No. 406,656, Mar. 20, 1995, abandoned, which is a continuation of Ser. No. 201,278, Feb. 23, 1994, abandoned.

[30] Foreign Application Priority Data

Feb. 23, 1993 [JP] Japan .................... 5-033558

[51] Int. Cl.⁶ .......................................... G11C 7/00
[52] U.S. Cl. .................. 365/203; 365/190; 365/149
[58] Field of Search .................................. 365/190, 149, 365/203, 202, 207, 208; 307/530; 327/51, 52

[56] References Cited

U.S. PATENT DOCUMENTS

| | | | |
|---|---|---|---|
| 5,115,412 | 5/1992 | Tobita | 365/190 |
| 5,124,947 | 6/1992 | Nakada | 365/190 |
| 5,153,459 | 10/1992 | Park et al. | 365/190 |
| 5,285,416 | 2/1994 | Tokami et al. | 365/190 |

*Primary Examiner*—A. Zarabian
*Attorney, Agent, or Firm*—Loeb & Loeb LLP

[57] ABSTRACT

A semiconductor integrated circuit includes a cell matrix having a large number of DRAM cells in a matrix shape; a plurality of bit line pairs which have a plurality of bit lines; a plurality of bit line differential amplifier circuits each provided in each pair of bit lines for amplifying a potential difference between the first and second bit lines; a pair of data lines for receiving a charge transmission from the bit line pairs and having a first data line connected to the first bit lines and a second data line connected to the second bit lines; a switch circuit for turning on/off the charge transmission from each bit line pair to the data line pair; a data line differential amplifier circuit for amplifying the potential difference between the first and second bit lines of the data line pair; and an amplitude limiting circuit including a transistor which has a source electrode connected to anyone of the first and second data lines, a drain electrode connected to the other of the first and second data lines, and a gate electrode having a gate potential set in the manner that the gate is conductive when the potential difference between the first and second data lines becomes a predetermined regulated value while the data line differential amplifier circuit is activated, thereby limiting an amplitude between the first and second data lines less than the predetermined regulated value by means of a conduction of the transistor.

115 Claims, 7 Drawing Sheets

SEMICONDUCTOR INTEGRATED CIRCUIT APPLICABLE TO DATA READ CIRCUIT FROM MEMORY

This is a continuation of application Ser. No. 08/406,656, filed Mar. 20, 1995, now abandoned, which is a continuation of application Ser. No. 08/201,278, filed Feb. 23, 1994, now abandoned.

BACKGROUND OF THE INVENTION

The present invention relates to a semiconductor integrated circuit, and more specifically, to a semiconductor integrated circuit capable of applying to a data reading circuit which reads out data stored in cells of a dynamic random access memory (DRAM).

An improvement of an integrated degree is one of the most important subjects for various large scale integrated circuits (LSI), which holds true for a DRAM without exception.

FIG. 1 shows a read circuit which reads bit line data of the DRAM to an external of a chip, and FIGS. 2A–2E show waveforms of reading operation. Hereunder, a symbol "*" is used as an indication of a negative logic, for example, in the case of the negative logic of a signal "D", there is represented as "*D".

In FIG. 1, the read circuit transmits data stored in a specified address memory cell in a plurality of memory cells 301 through a corresponding pair of bit lines BL1, *BL1; BL2, *BL2; . . . to a pair of data lines DQ and *DQ which are shared with all of bit lines corresponding to a row address. The data are transmitted from the pair of data lines DQ and *DQ through a pair of data lines D and *D to a pair of data lines R and *R, and finally outputted from an output circuit 312 as a read data $D_{OUT}$.

The memory cells 301 corresponding to each column address are connected to a word line of each row address, and input ends of a differential amplifier circuit 302 are connected to each pair of bit lines of the memory cells 301. The differential amplifier circuit 302 is controlled by control signals SAP and *SAN with respect to an activated and inactivated conditions. When the signal SAP is "H" and the signal *SAN is "L", the circuit 302 is activated to amplify a fine potential difference between the corresponding bit lines. Output ends of the differential amplifier circuit are connected through a corresponding switch circuit 303 to a pair of data lines DQ and *DQ. A conduction or non-conduction of the switch circuit 303 is controlled by control signals CSL1, CSL2, . . . which are independently inputted, respectively. When the control signal CSL is "H", the switch circuit 303 becomes the conductive condition so as to cause the pair of bit lines to be electrically connected to the pair of data lines DQ, *DQ, thereby transmitting data of the pair of bit lines to the pair of data lines DQ and *DQ. Numeral 304 denotes an equalizing circuit, and the conductive or non-conductive condition is controlled by a control signal *E, in which the data lines DQ and *DQ are precharged to be a high-impedance condition when the control signal *E is "L". After a completion of the high-impedance condition, the switch circuit 303 is activated to be kept the pre charge condition or to be discharge condition corresponding to a level of the pair of bit lines, thereby transmitting the data of the pair of the bit lines to the pair of the data lines DQ and *DQ.

The data of the data lines DQ and *DQ are transmitted through a switch circuit 307 to the data lines D and *D. The switch circuit 307 is controlled of its conductive or non-conductive condition by the control signal S. Numeral 308 denotes an equalizing circuit of the data lines D and *D, and a conductive or non-conductive condition of transistors included in the equalizing circuit 308 is controlled by the control signal *E. Namely, when the control signal *E is "L", the transistors become the conductive condition to cause the data lines D and *D to be precharged. A transmission principle that the data of the data lines DQ and *DQ are transmitted to the data lines D and *D by means of the conduction of the switch circuit 307, is the same as the principle through the switch circuit 303. A differential amplifier 309 is connected to the data lines D and *D, an activated or non-activated condition of which is controlled by the control signals *E and QSE. When the control signal *E is "H" and the control signal QSE is "H", the differential amplifier 309 is activated so as to amplify the potential difference of the data lines D and *D.

The data of the data lines D and *D are transmitted to data lines R and *R each through potential transmission circuits 310 and 311 which are provided corresponding to each line, respectively. The conductive or non-conductive condition of the potential transmission circuit 310 and 311 is controlled by the control signal *E. When the control signal *E is "H", a potential of the each of data lines D and *D is transmitted to each of data lines R and *R. An output circuit 312 outputs the data based on the potential of the data lines R and *R as read-out data $D_{OUT}$ toward external of the chip.

Numerals 305 and 306 are write control circuits, which are respectively comprised of inverters having an ON/OFF condition to be controlled by write enable signals WE and *WE. Write data WD and *WD are inputted through the inverters into the data lines DQ and *DQ, and are written into the memory cell 301 selected.

Next, operation of the read circuit will be described with reference to FIG. 1 and also FIGS. 2A–AE. In these figures, there is described the case where, after the data of the bit lines BL1 and *BL1 are read in a region I, an address is changed over in a region II so as to read the data of the bit lines BL2 and *BL2.

A word line WL first rises up so as to transmit data in each of the memory cells 301 to the bit lines BL1, *BL1; BL2, *BL2. After a fine potential difference occurs between the bit lines BL1-*BL1 and between the bit lines BL2-*BL2, the signal *SAN is reduced from the bit line potential to the ground potential, and the signal SAP is increased from the bit line potential to a predetermined potential, thereby activating the differential amplifier 302 to amplify the potential difference of the bit lines (in a time period $T_a$ in FIGS. 2A–2E).

Next, the signal *E rises up to control equalizing circuits 304 and 308 which cause the data lines DQ, *DQ, D, *D, R and *R to keep the power source potential so as to be a high-impedance condition. After that, the control signals CSL1 and S rise up for controlling the switch 303 (connecting the bit lines BL1 and *BL1 with the data lines DQ and *DQ) and the switch 307 connecting the data lines DQ and *DQ with the data lines D and *D), respectively, so as to cause the switches 303 and 307 to be non-activated, thereby transmitting charges of the bit lines to both of the data lines DQ, *DQ and D, *D. After that, the signal S rises to cause the switch 307 to be non-activated, and at the same time, the signal QSE rises to activate the differential amplifier circuit 309 of the data lines D and *D, thereby amplifying the fine potential difference of the data lines D and *D (refer to the time periods $T_b$, $T_c$ and $T_d$ of FIGS. 2A–2E). Amplified data of the data lines D and *D are supplied to the transmission circuit 310 and 311 as described above, and output data of the circuits 310 and 311 are transmitted through the data lines R and *R and the output circuit 312 as the output data $D_{OUT}$ from the chip to the external.

Next, when the address inputted to the chip changes and this change is received by an in-chip control circuit, the signal CSL1, which connects the bit lines BL1 and *BL1 with the data lines DQ and *DQ, rises to cause the switch 303 to be non-activated. At substantially the same time, the control signal *E and S trail to increase the data lines DQ, *DQ; D, *D; R and *R up to an "H" level. When the potential of each of the data lines rises to the same potential, the control signal *E is changed to the "H" level so as to turn off the charging circuits 304 and 308 and the transmission circuits 310 and 311. At the same time, the control signal CSL2 rises up to cause the switch 303 to be activated, thereby transmitting the data of the bit lines BL2 and *BL2 to the data lines DQ and *DQ. The potential difference between the data lines DQ and *DQ is transmitted through the switch 307 to the data lines D and *D, and at the time point where the fine potential difference occurs between the data lines D and *D, the control signals S and QSE rise to cause the differential amplifier circuit 309 to be activated, thereby amplifying the potential difference between the data lines D and *D. The potential is transmitted through the transmission circuits 310 and 311 to the data lines R and *R, and further transmitted to the output circuit 312 so as to output the chip output $D_{OUT}$.

However, in such a DRAM circuit described above, the problem resides in that the improvement of the integrated degree cause access operation to be reduced. The cause of the above problem relates to a securement of the equalizing time in the data lines DQ and *DQ.

Namely, such data lines DQ and *DQ have a load capacitance usually larger than that of the data lines D and *D, and this condition can be understood by FIGS. 2A–2E. When the integrated degree improves to increase the memory capacitance, the data lines DQ and *DQ are connected to a large number of the bit lines according to the increase of the memory capacitance, thereby increasing the load capacitance. Namely, the data lines DQ and *DQ have the large time constant. Therefore, for sufficiently equalizing the data lines DQ and *DQ to secure the data read, the time to secure reading (the period to cause the equalizing control signal E to be "L") should be long corresponding to the securement, thereby resulting the decrease of the operational speed caused by the improvement of the integrated degree.

Also, high-speed operation becomes one of the most important matter with the high integrated degree, the operational speed of the LSI device around the memory has been increasing steadily. Accordingly, with this improvement, high speed operation with respect to the access speed of the DRAM is required more and more.

SUMMARY OF THE INVENTION

In view of the problems included in the above prior art, an object of the present invention is to provide a semiconductor integrated circuit capable of realizing shortening of the equalizing time in DRAM.

A semiconductor integrated circuit according to the present invention comprises a memory cell matrix including a plurality of the dynamic random access memory (DRAM) cells, a plurality of word lines provided with each row address of the cell matrix, a plurality of pairs of bit lines provided with each column address of the cell matrix and each pair having at least a first and second bit lines in each pair, a bit line differential amplifier circuit for amplifying potential difference between the first and second bit lines of each pair of bit lines, a plurality of pairs of data lines for receiving a charge transmission from the plurality of the bit lines and each pair having at least a first and second bit lines, a data line differential amplifier circuit for amplifying potential difference between the first and second data lines of each pair of data line, and an amplitude limiting circuit including a transistor having a source electrode connected to any of the first and second data lines, a drain electrode connected to the other of the first and second data lines, and a gate electrode having a potential in the manner of causing the transistor to be a conductive condition when a potential difference between the first and second data lines becomes a regulated value during an activated interval of the data line differential amplifier circuit, thereby functioning to limit an amplitude between the first and second data lines less than the regulated value by conducting the transistor.

The transistor constituting the amplitude limiting circuit is not limited to any of N-channel metal oxide layer semiconductor (MOS) and P-channel MOS.

In the case of the NMOS, a gate potential needs to be less than "$V_{cc}+V_{th}$" ($V_{th}$ is a threshold value of the transistor) at least within an activated period of the data line differential amplifier circuit (accordingly, the gate potential may be less than "$V_{cc}+V_{th}$" for all of the period). Namely, if the gate potential becomes more than "$V_{cc}+V_{th}$", the transistor is turned on before an occurrence of the potential difference between the first and second data lines, thereby resulting an incapability of sensing. Within a range without an interference for sensing operation, the nearer to "$V_{cc}+V_{th}$" the gate potential is, the smaller potential difference between the first and second data lines the transistor becomes the conductive condition, thereby reducing the amplitude control value smaller.

If the absolute potential of the pair of the data lines increases more than the degree that the data transmission circuit to transmit data for the final end data line does not perform an erroneous operation ($V_{cc}/2$), it is no problem for reading the data on the basis of the principle of the differential amplification for assuming sensing operation.

Next, in the case of PMOS, within the activated period of the data line differential amplifier circuit, the gate potential should be less than "$V_{GND}$ (gate ground level)+$V_{cc}-V_{th}$", and in the period without the above period, the gate potential needs to be set more than the above level.

By the present invention, since the amplitude between the first and second data lines is limited, an equalization of the data lines can be performed in a short time according to the equalization, thereby contributing the high-speed operation for accessing to the DRAM.

Furthermore, since the equalization is completed in a short time, it is possible to sufficiently equalize the data lines by the ling equalizing time, thereby contributing an improvement for the sensing margin.

Still furthermore, an NMOS transistor is applied to the transistor for constituting the amplitude limiting circuit, since the amplitude limited effect can be obtained only by keeping the gate potential level to be a predetermined value during entire period, it is unnecessary to provide a specific signal generation circuit for controlling the gate potential, thereby suppressing a complicated circuitry, for example, providing only a bias circuit.

As described above, since the amplitude between the first and second data lines is limited in the present invention, the equalization between the data lines can be completed in a short time, thereby resulting an effect for contributing a high speed operation for accessing to the DRAM.

Furthermore, since the equalization is completed in a short time, if the equalizing time is to be long, it is possible to sufficiently equalize the data lines, thereby contributing the improvement of the sense margin.

Also, by providing the NMOS transistor as a transistor constituting the amplitude limit circuit, it is possible to obtain the amplitude limit effect only by keeping the gate potential level to be predetermined value during entire periods, it is unnecessary to provide the specific signal generation circuit for controlling the gate potential, thereby miniaturizing the entire circuitry by providing only a bias circuit.

DETAILED DESCRIPTION OF THE PREFERRED EMBODIMENTS

There will be described in detail a semiconductor integrated circuit for reading data from a DRAM according to preferred embodiments of the present invention in reference with the attached drawings.

Figure 3:
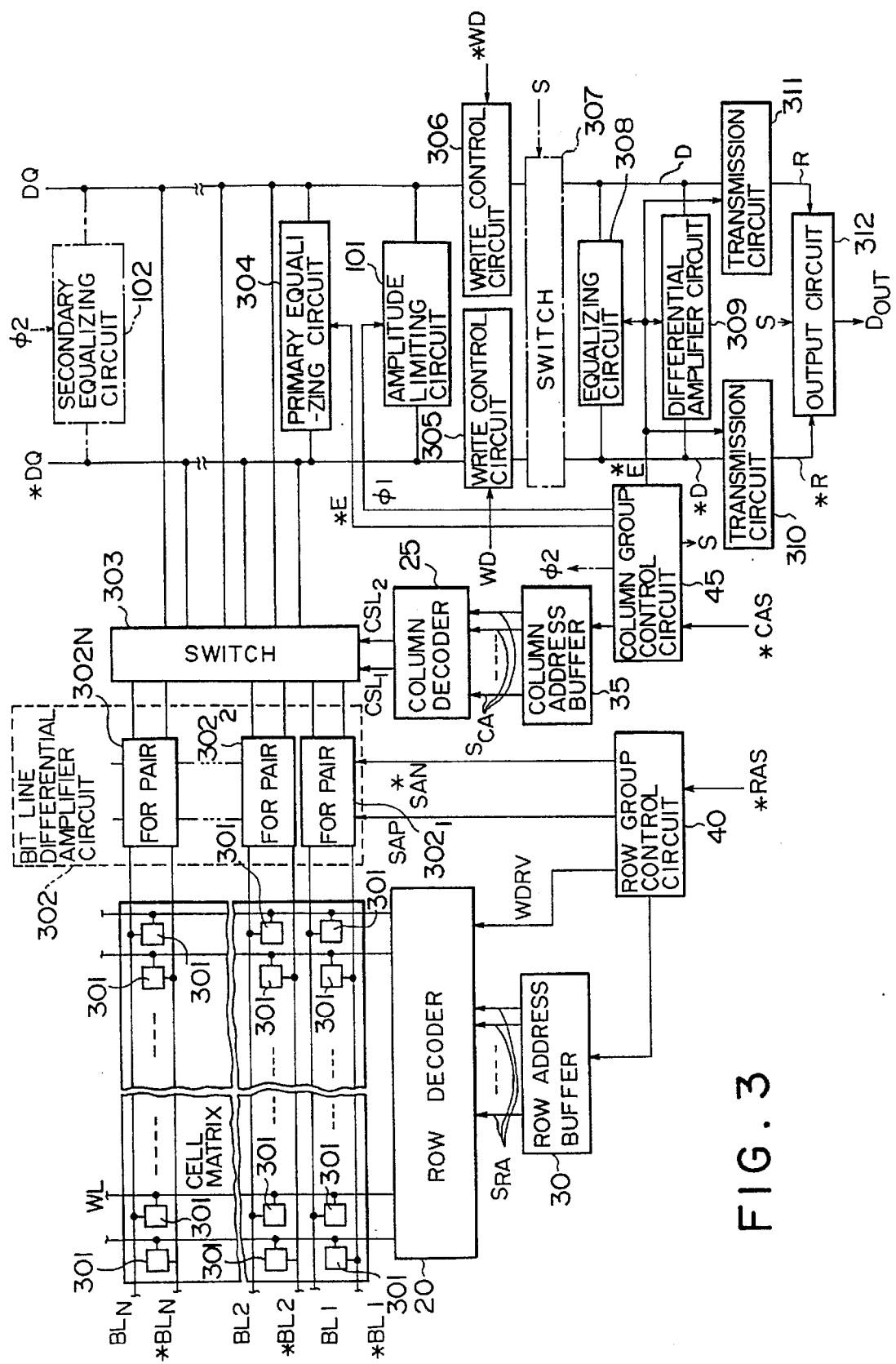
FIG. 3 is a block diagram showing a schematic constitution of a semiconductor integrated circuit for reading data from DRAM according to embodiments of the present invention.

FIG. 3 is a block diagram showing a schematic constitution of a semiconductor integrated circuit for reading data from a DRAM according to embodiments of the present invention.

In the figure, a cell matrix 300 has a constitution that a large number of memory cells 301 . . . are arranged in a matrix shape along two directions at a right angle each other. The cell matrix 300 comprises a plurality of word lines WL . . . extending along one direction (actually in the vertical direction in FIG. 3) and a row decoder 20 provided on one ends of these word lines WL. Along the direction at a right angle of the above one direction (actually in the horizontal direction in FIG. 3), there are provided a plurality of bit line pairs BL1, *BL1; BL2, *BL2; . . . ; and $BL_N$, *$BL_N$ each pair including a regular bit line and an inverted bit line. Ends of the bit lines have a differential amplifier circuit 302 which is comprised of particular differential amplifiers of each of the bit line pairs BL1, *BL1; BL2, *BL2; . . . ; $BL_N$, *$BL_N$.

Outputs of the differential amplifier circuit 302 is connected through a switch circuit 303 to a pair of data lines DQ and *DQ, respectively. The pair of data lines DQ and *DQ has the configuration as the conventional circuit for reading the data, to which an equalizing circuit 304 and write control circuit 305 and 306 are connected. However, the circuit for reading the data according to preferred embodiments of the present invention comprises an amplitude limit circuit 101 and secondary equalizing circuit 102, which are further connected to the pair of the data lines DQ and *DQ. There will be described later in detail the circuit 101 and 102.

The pair of the data lines DQ and *DQ is connected to a switch circuit 307 to which one ends of a pair of data lines D and *D are connected, while the other ends of the pair of data lines are connected to transmission circuits 310 and 311. The pair of the data lines D and *D also has an exclusive equalizing circuit 308 and differential amplifier circuit 309. Furthermore, outputs of transmission circuits are supplied through data lines R and *R to an output circuit 312 so as to be outputted to the external as output data $D_{OUT}$. The components described in this paragraph are the same as the conventional reading circuit shown in FIG. 1.

The constitution of the semiconductor integrated circuit for reading data consists of a row address buffer 30 for supplying row address signals $S_{RA}$ to the row decoder 20, and a row system control circuit 40 which outputs a control signal to the row address buffer 30, a word line driving signal WDRV to the row decoder 20, and control signals SAP and *SAN to the bit line differential amplifier circuit 302, in correspondence with an input of a signal *RAS. Furthermore, for reading in the column direction, the circuit comprises a column decoder 25 for supplying control signals CSL1 and CSL2 to the switch circuit 303, a column address buffer 35 for outputting column address signals $S_{CA}$ to the column decoder 25, and a column system control circuit 45 which outputs on the basis of an input of a signal *CAS, a control signal to the column address buffer 35, a control signal Φ1 to the amplitude limiting circuit 101, a control signal Φ2 to the secondary equalizing circuit 102, and a control signal *E respectively to the primary equalizing circuit 304, the circuit 308, the differential amplifier circuit 309 and the transmission circuits 310 and 311.

Even though the detailed description is omitted in this portion, the column system control circuit 45 controls the switch circuit 307 by a control signal S on the basis of a write enable signal, and controls operation of the output circuit 312.

Next, supposing the schematic constitution shown in FIG. 3, the circuit for reading data according to a first embodiment of the present invention will be described in detail with reference to FIG. 4 and FIGS. 5A-5E.

Figure 4:
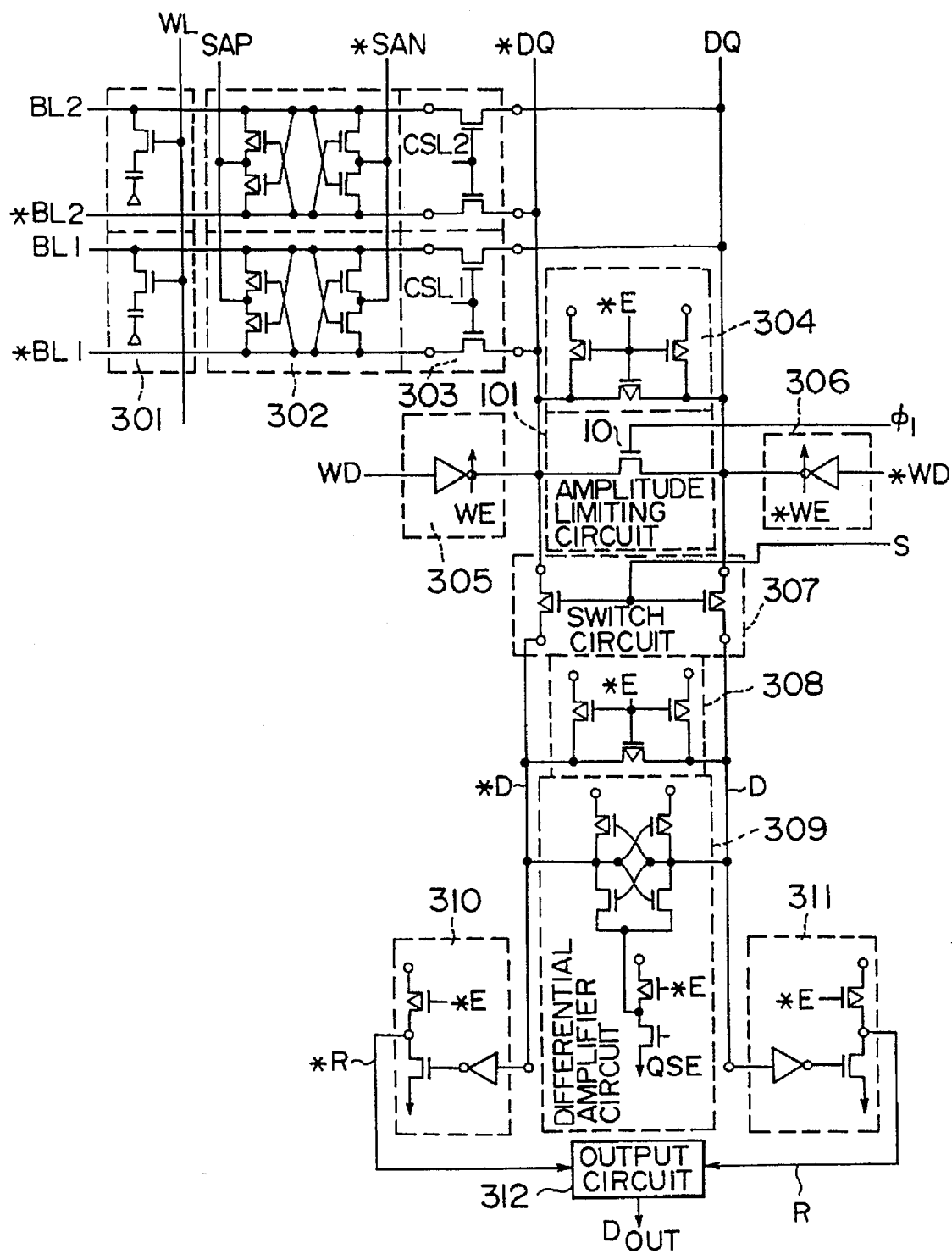
FIG. 4 is a circuit diagram showing a concrete constitution of a semiconductor integrated circuit according to a first embodiment of the present invention.

FIG. 4 shows a constitution of the circuit for reading the DRAM according to the first embodiment of the present invention, and FIGS. 5A-5e show waveform of reading operation of the circuit shown in FIG. 4.

In FIG. 4, numeral 101 is the amplitude limiting circuit showing a subject matter according to the present invention, which has an NMOS transistor 10 as a component. The transistor 10 has a drain which is connected to the data line DQ, a source which is connected to the data line *DQ, and a gate to which a control signal Φ1 is supplied from the column system control circuit. While the differential amplifier circuit 309 is activated, if the control signal Φ1 is set to "H", and when a potential of the data line *DQ, that is, the source potential of the transistor 10 decreases to a threshold voltage $V_{th}$ less than the gate potential, the transistor 10 becomes a conductive condition, so that the potential difference between the source and gate of the transistor 10 rarely increases to more than the threshold value $V_{th}$. Namely, when the transistor 10 becomes the conductive condition, a current flows from the data line DQ to the data line *DQ, and the data lines DQ and *DQ are clamped to the intermediate potential to be kept the substantially same potential, on the basis of two abilities. One is to balance of an increase and a decrease of the potential of the bit lines BL1 and *BL1 by the difference amplifier circuit 302 connected through the switch circuit 303 to the bit line BL1. The other is the ability as an active load. Accordingly, the maximum potential difference with respect to the data lines DQ and *DQ under this operational condition that is limited to the degree substantially the same as the threshold value $V_{th}$ of the transistor 10, which is different from the potential difference of the prior art shown in FIGS. 2A–2E.

Figure 5:
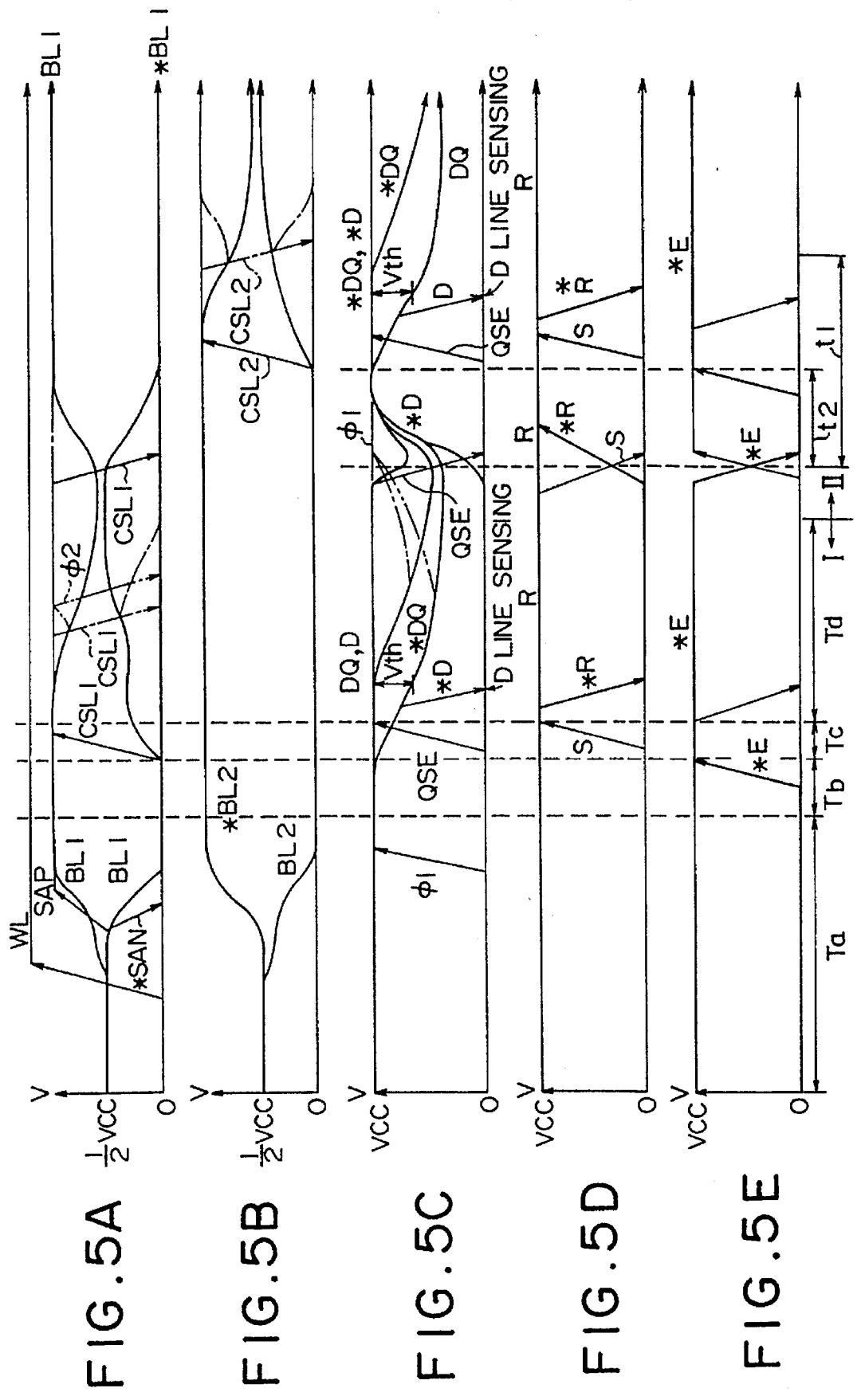
FIGS. 5A-5E are time charts showing operation waveforms of the semiconductor IC shown in FIG. 4.

Here, as shown in FIG. 5C, the control signal Φ1 rises up when the an amplification of the bit line potential during the period $T_a$, and after that, the signal is kept to be "H" during reading operation, even though the condition is not shown in the figure. This contributes the reduction of the equalizing time.

Figure 1:
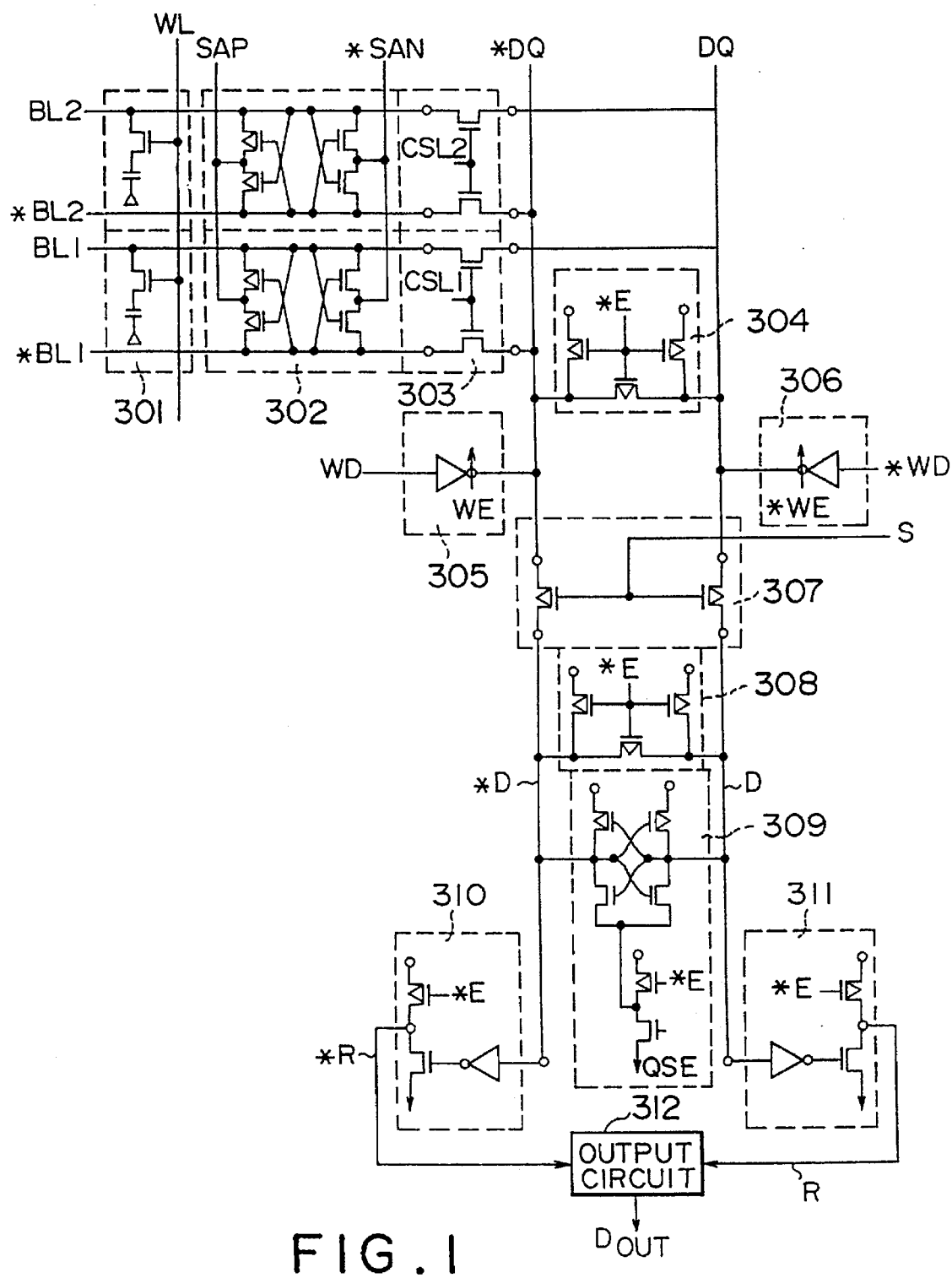
FIG. 1 is a circuit diagram showing a constitution of the conventional semiconductor integrated circuit for reading data from DRAM.
Figures 2A, 2B, 2C, 2D, 2E:
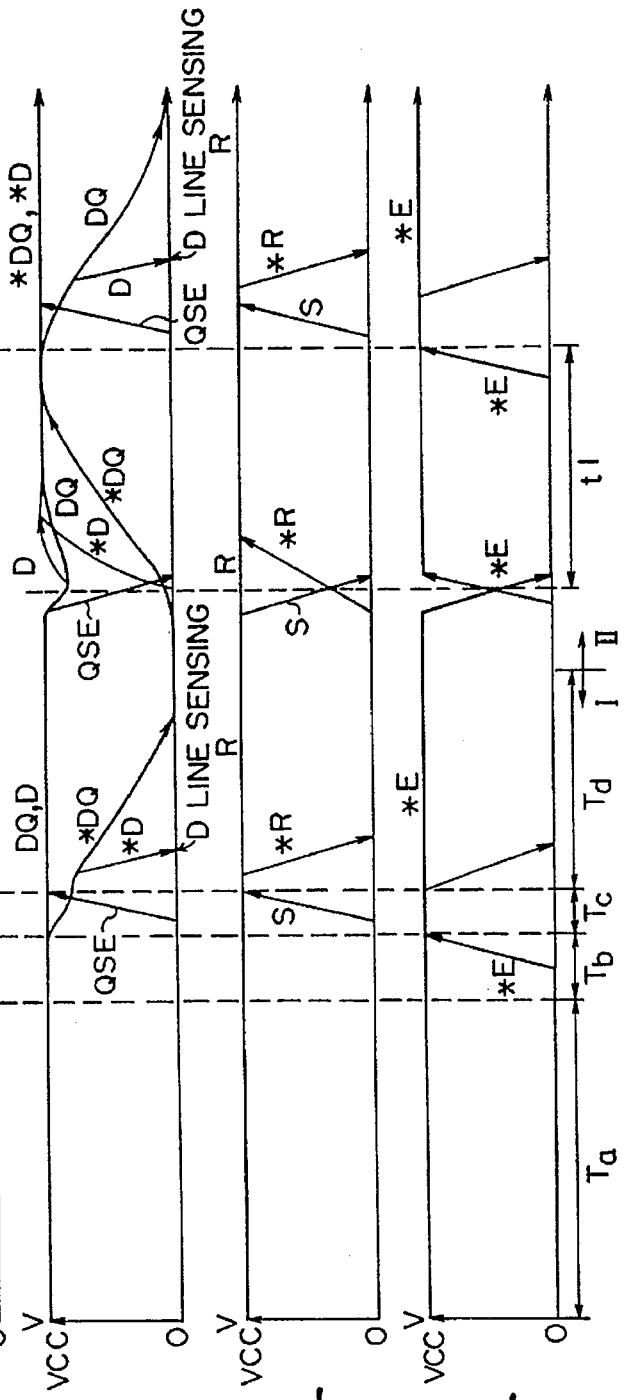
FIGS. 2A-2E are time charts showing operation waveforms of the circuit shown in FIG. 1.

Namely, in the region I of FIGS. 5A–5E, as the same manner of the circuit shown in FIG. 1, the word line WL rises up first, the data in each memory cell 301 are transmitted to the bit lines BL1, *BL1; BL2, *BL2. After a little potential difference occurs between the bit lines BL1–*BL1 and BL2–*BL2, the signal *SAN trails from the bit line potential to the ground potential, and the signal SAP rises from the bit line potential to a predetermined high potential, thereby activating the differential amplifier circuit 302 and amplifying the potential difference of bit lines (the time period $T_a$ in FIGS. 5A–5E). Immediately before the potential difference of the bit line BL in this period $T_a$ becomes a saturated condition, the control signal Φ1 rises.

Next, the signal *E rises for controlling the equalizing circuit to keep the data lines DQ, *DQ; D, *D; and R, *R to the power source potential, thereby causing the data line DQ, *DQ; D, *D; and R, *R to be a high-impedance condition (the period $T_b$ of FIGS. 5A–5B). After that, the control signal CSL1 rises for controlling the switch circuit 303 which connects the bit lines BL1 and *BL1 and the data lines DQ and *DQ, thereby causing the circuit 303 to be conductive. The control signal S trails for controlling the switch circuit 307 which connects the data lines DQ and *DQ with the data lines D and *D, thereby causing the circuit 307 to be conductive. Under the condition, charges of the bit lines is transmitted to the data lines DQ and *DQ, and further to the data line D and *D. After that, the signal S rises up to cause the switch circuit 307 to be non-conductive, and at substantially the same time, the signal QSE rises to activate the differential amplifier circuit 309 of the data lines D and *D (the period $T_c$ of FIG. 5A–5E), thereby amplifying the fine potential difference of the data line D and *D (period $T_d$ of FIG. 5A–5E). At the intermediate of the period $T_d$, when the potential of the data line *DQ decreases until the potential difference between the control signal Φ1 and the data line *DQ becomes the value $V_{th}$, the transistor 10 becomes the conductive condition, thereby taking effect on the potential difference limiting function so as to decrease the potential difference of the data lines DQ and *DQ step by step. The data on the data lines D and *D are sensed by the differential amplifier circuit 309 before the potential difference of the data line DQ and *DQ becomes the threshold value $V_{th}$, so that the data of the data line D and *D are supplied to the transmission circuit 310 and 311 which have outputs transmitted through the data liens R and *R and the output circuit 312 to the external as output data $D_{OUT}$ of the semiconductor integrated circuit.

There will be described circuit operation at address transition corresponding to the region II in FIGS. 5C–5E.

When a control circuit (now shown) receives an address transition and the control signals CSL1 and *E fall, the charge starts for the data lines DQ, *DQ, D, *D; and R, *R. However, since the potential difference between the data lines DQ and *DQ becomes smaller than the conventional circuit by the contribution of the transistor 10, it is possible to largely shorten the equalizing time of the data lines DQ and *DQ, which has conventionally required large time, namely, it was necessary to require a time t1 conventionally and it is possible to shorten the time t1 to t2. This time difference "t1–t2" corresponds to a shortened time of the reading time.

On the contrary, when the time is not be shortened to the period t2, since it is possible to sufficiently equalize the data lines DQ and *DQ with increased time from the period t2, the sensing margin can be improved.

There is performed the same operation as the conventional circuit that the control signal CSL2 rises up, the data lines DQ, *DQ; and D, *D respectively have the different potential to result the potential difference, the differential amplifier circuit 309 is activated, and the output data $D_{OUT}$ is outputted through the data lines R and *R.

Next, the potential of the control signal Φ1 is sufficient to be a level less than threshold value $V_{th}$ in addition to the level of the "H" side of the data lines DQ and *DQ. In this region, the higher the control signal Φ1 becomes, the smaller the potential difference of the data lines DQ and *DQ can be made.

The transistor 10 is not limited in an NMOS, may be constituted by a PMOS. In the case of the PMOS, it is desired to pay attention for setting control signals.

The control signal Φ1 to the NMOS is supposed better to be maintained to "H" at least while the differential amplifier 309 is activated, the signal Φ1 can be substituted for the control signals S and QSE or the like. Furthermore, a gate may be biased to keep the "H" level condition while the entire periods.

When the transistor 10 is made of the PMOS, the gate control signal is first inverted. However, it is necessary to partially control level in a specified period, so that the control signal can not be set to "L" during entire periods.

In the case that the transistor 10 is made from the PMOS, a source thereof is connected to the data line DQ and a drain is connected to the data line *DQ. When the potential difference between the gate and the source or the drain becomes the threshold level $V_{th}$, the PMOS transistor becomes in the conductive condition to function potential difference limiting for the data lines DQ and *DQ.

Here, if it is supposed that the gate of the PMOS transistor is biased to the "L" level during the entire periods, the differential amplification is incomplete because there is established the condition that the potential difference between the gate and the source or the drain becomes the threshold value $V_{th}$ while the differential amplifier circuit 309 is not activated. Accordingly, in the case where the PMOS is used for the transistor 10, it is necessary that the gate control signal is changed over to the level "H" only while the differential amplifier circuit is not activated.

As a result, if the NMOS is used for the transistor 10 in the circuit as the manner of the first embodiment, there is advantageous that it is possible to eliminate the circuit for making the control signal Φ1 and the like.

Figure 6:
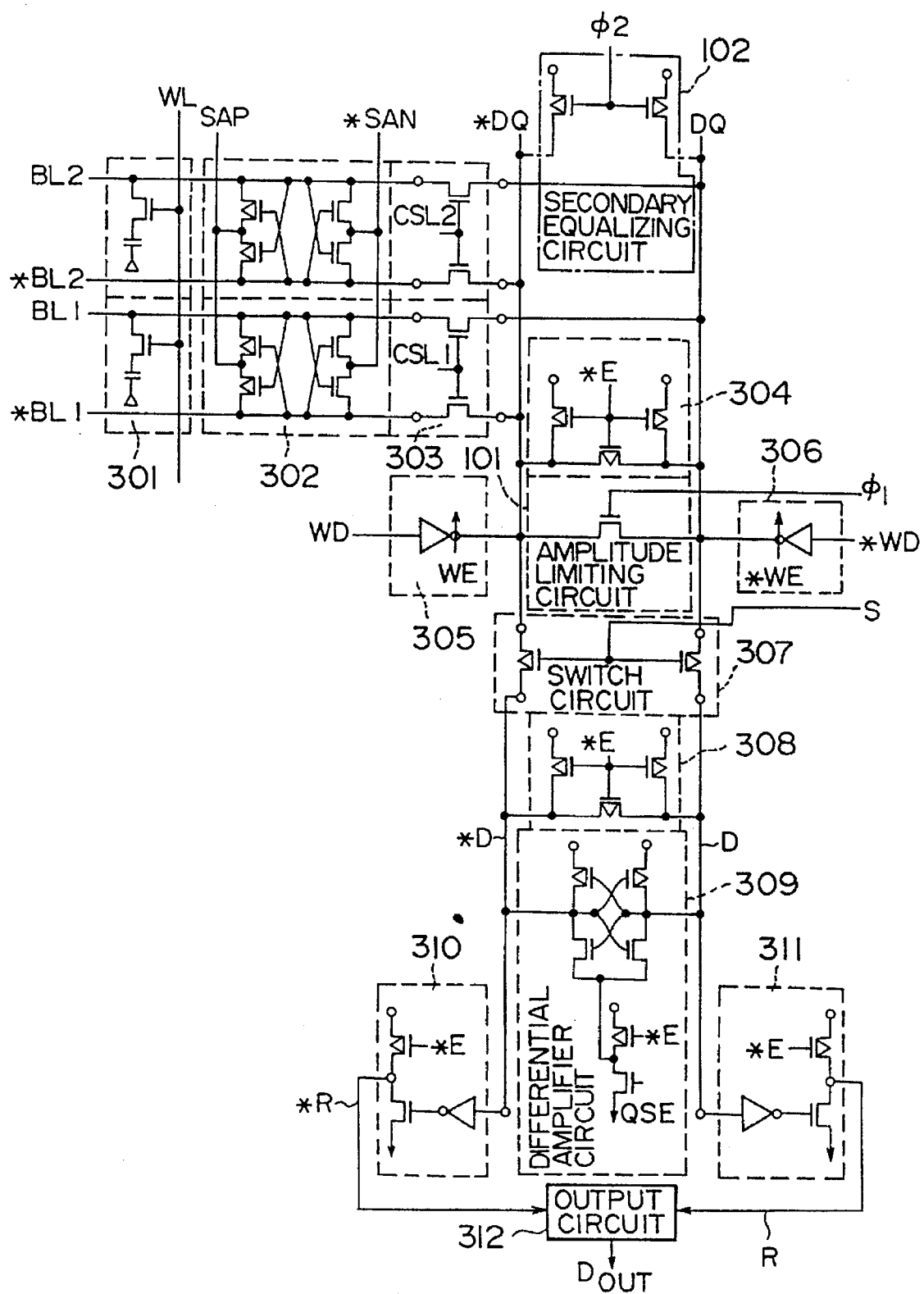
FIG. 6 is a circuit diagram showing a semiconductor integrated circuit according to a second embodiment of the present invention.

Even though the concrete circuit of the first embodiment shown in FIG. 4 does not have the secondary equalizing circuit as shown by a two-dot chain line at the upper portion of the data lines DQ and *DQ in FIG. 3, the circuit of the present invention may be comprised of a secondary equalizing circuit 102 such as a semiconductor integrated circuit according to a second embodiment as shown in FIG. 6. The secondary equalizing circuit 102 causes the control signals CSL1 and CS2 shown by a dot chain line in FIGS. 5A and 5B to rise up in the pulse shape. Since the circuit 102 is made from PMOS transistors 12 and 14, the circuit 102 is often called as a P channel equalizing circuit having a gate to which a control signal Φ2 is supplied. The control signal Φ2 is caused to trail down to the "L" level after completing sensing operation of the data lines D and *D so as to be conductive condition of the transistor. Therefore, the data lines DQ and *DQ are charged as the manner shown by a virtual line in FIG. 5C, and trailing of the control signal *E causes the equalizing circuit 304 to continue charging to the voltage $V_{cc}$ successively. Also, since the control signal CSL rapidly trails down, operation in the bit lines does not flow a current to the data line DQ, it is possible to complete for equalizing the data lines DQ and *DQ in a shorter time by reaching to a predetermined potential rapidly as shown by a dot chain line in FIG. 5C after the control signal trails down.

Figure 7:
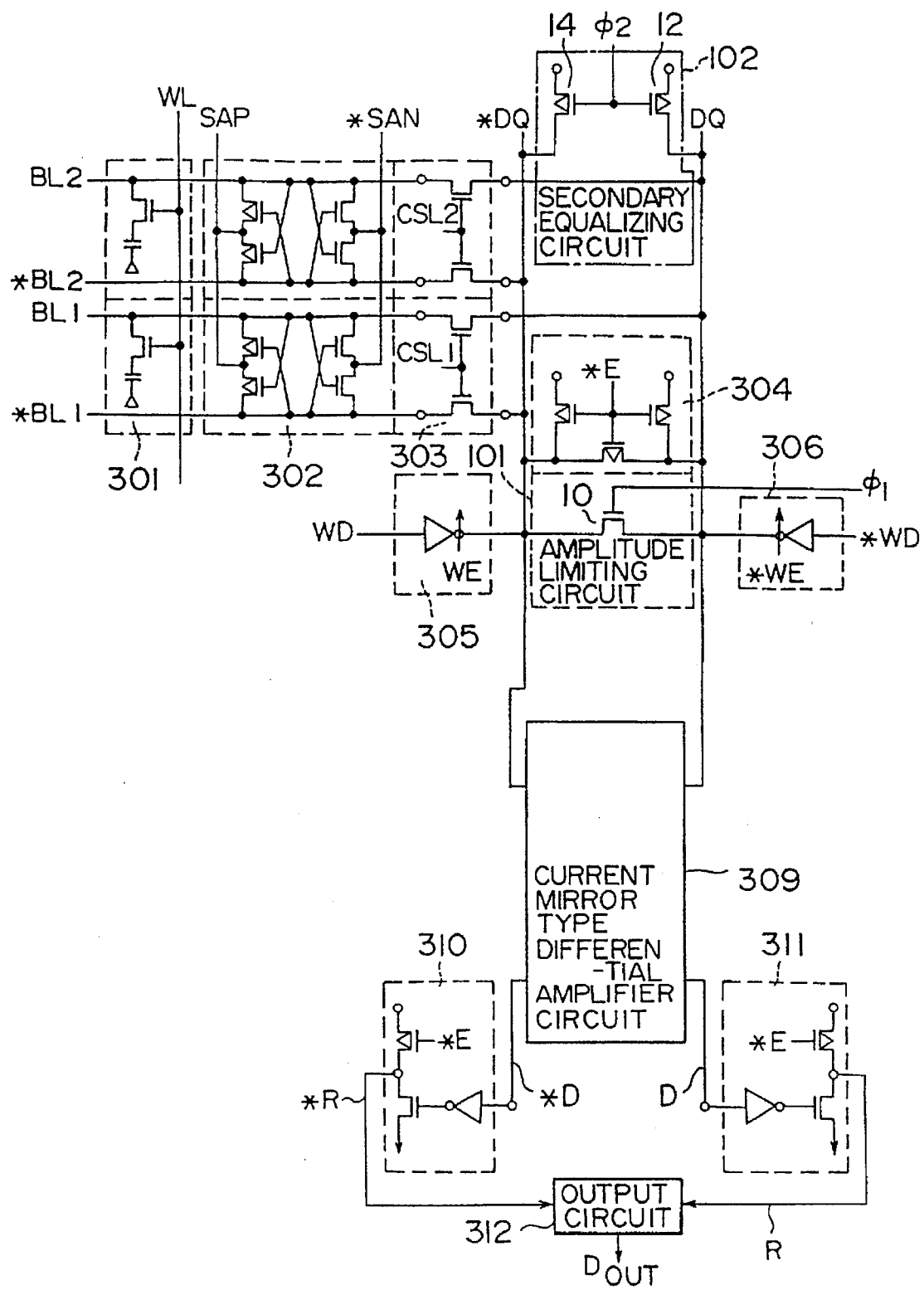
FIG. 7 is a circuit diagram showing a semiconductor integrated circuit according to a third embodiment of the present invention.

Furthermore, since the differential amplifier circuit 309 shown in FIG. 4 fully amplifies the data lines D and *D which are respectively connected to the data lines DQ and *DQ, both of the data lines should be divided by the switch circuit 307. However, when the differential amplifier circuit is comprised of a current mirror circuit having an active load, which receives the data lines DQ and *DQ only by gate of the transistor to supply outputs of the data lines DQ and *DQ to the data transmission circuits 310 and 311 through the active load to transmit them to the data lines R and *R, it is unnecessary to provide the switch circuit 307 because the differential amplifier circuit functions itself the part of the switch circuit. Namely, as shown in FIG. 7, a semiconductor integrated circuit according to a third embodiment may comprised of a current mirror type differential amplifier circuit 103 which is connected between the data lines D and *D for serving as a switch circuit. Since the data line D and *D connect the amplifier circuit 309 with the transmission circuits 310 and 311, respectively, the equalizing circuit 308 for the data lines D and *D can be eliminated.

What is claimed is:

1. A semiconductor integrated circuit for reading data in memory cells comprising:

a memory cell matrix having a dynamic random access memory (DRAM) cells arranged in a plurality of rows and a plurality of columns along two directions which are at right angles to each other;

a plurality of word lines each arranged at one row of said plurality of rows of said cell matrix;

a plurality of bit line pairs which have a pair of bit lines arranged at each column of said plurality of bit line pairs of said cell matrix, and each pair of which has a first and a second bit line for reading said data;

a plurality of bit line differential amplifier circuits, each of which is provided for each pair of the plurality of said bit line pairs and amplifies a potential difference between said first and second bit lines;

a pair of data lines having a first data line coupled to the plurality of said first bit lines and a second data line coupled to the plurality of said second bit lines;

a first switch circuit, provided between the plurality of said bit line differential amplifier circuits of each pair of the plurality of pairs of said bit lines and said pair of data lines, for turning on and off a charge transmission from each of said bit line pairs to said data line pair;

a data line differential amplifier circuit for amplifying the potential difference between said data line pair; and an amplitude limiting circuit consisting of an N channel metal oxide semiconductor (NMOS) transistor which has a source electrode directly connected to one of said first and second data lines, a drain electrode directly connected to the other of said first and second data lines, and a gate electrode having a gate potential set such that the NMOS transistor is conductive when the potential difference between said first and second data lines becomes a predetermined regulated value while the data line differential amplifier circuit is activated, thereby limiting an amplitude between said first and second data lines to less than said predetermined regulated value by conduction of said transistor, wherein the gate potential of the NMOS transistor is set such that the NMOS transistor is conductive at least during part of a time period when the first and second data lines are not being precharged to and equalized at a precharge potential.

2. The semiconductor integrated circuit according to claim 1, wherein particular connecting points between said amplitude limiting circuit and said first and second data lines are respectively connected to first and second write control circuits which respectively supply first and second write data to said first and second data lines.

3. The semiconductor integrated circuit according to claim 1, further comprising:

a main equalizing circuit which equalizes said first and second data lines by charging the first and second data lines to a power source potential in response to a first control signal; and a secondary equalizing circuit, operative for a predetermined period of time, which charges said first and second data lines.

4. The semiconductor integrated circuit according to claim 3, wherein said secondary equalizing circuit comprises first and second P channel MOS transistors which have drain electrodes each connected to said first and second data lines, source electrodes each connected to the power source potential, and gate electrodes which are connected with each other, and continuously assist equalizing operation of said main equalizing circuit by supplying a second control signal so as to start charging of said first and second data lines.

5. The semiconductor integrated circuit according to claim 1, wherein said first and second data lines are respectively connected to third and fourth data lines through a second switch circuit for performing ON/OFF operation on the basis of a third control signal; and said third and fourth data lines comprise:

a second equalizing circuit for equalizing a potential of said third and fourth data lines by charging the third and fourth data lines to a power source potential, and a second data line differential amplifier circuit for amplifying a potential difference between said third and fourth data lines.

6. The semiconductor integrated circuit according to claim 1, further comprising:

a fourth switch circuit provided between said amplitude limiting circuit and said data line differential amplifier circuit.

7. The semiconductor integrated circuit according to claim 1, wherein said first and second data lines are respectively connected to third and fourth data lines through connecting terminals;

said third and fourth data lines comprise a second data line differential amplifier circuit for amplifying a potential difference between said third and fourth data lines; and said second data line differential amplifier circuit comprises a current mirror type differential amplifier circuit which functions as a switch circuit for respectively switching over a connection of said first and third data lines and a connection of second and fourth data lines, said second data line differential amplifier circuit comprising a pair of transistors coupled to receive output signals at gate electrodes of the transistors.

8. A semiconductor integrated circuit for reading data in memory cells comprising:

a memory cell matrix having memory cells arranged in a plurality of rows and a plurality of columns along two directions which are at right angles to each other;

a plurality of word lines each arranged at one row of said cell matrix;

a plurality of bit line pairs which have a pair of bit lines arranged at each column of said cell matrix, and each pair of which has a first and a second bit line for reading said data;

a plurality of bit line differential amplifier circuits, each of which is provided for each pair of the plurality of said bit line pairs and amplifies a potential difference between said first and second bit lines;

a pair of data lines having a first data line connected to the plurality of said first bit lines and a second data line connected to the plurality of said second bit lines;

a first switch circuit, provided between the plurality of said bit line differential amplifier circuits of each pair of the plurality of pairs of said bit lines and said pair of data lines;

a data line differential amplifier circuit for amplifying the potential difference between said data line pair and for generating complimentary signals having a first signal and a second signal; and an amplitude limiting circuit consisting of an N channel metal oxide semiconductor (NMOS) transistor which has a source electrode directly connected to one of said first and second data lines, a drain electrode directly connected to the other of said first and second data lines, and a gate electrode having a gate potential set such that the NMOS transistor is conductive when the potential difference between said first and second data line becomes a predetermined regulated value while the data line differential amplifier circuit is activated, said amplitude limiting circuit limiting an amplitude between said first and second data lines to less than said predetermined regulated value, said predetermined regulated value being smaller than a voltage difference between said first and second signals, wherein the gate potential of the NMOS transistor is set such that the NMOS transistor is conductive at least during part of a time period when the first and second data lines are not being precharged to and equalized at a precharge potential.

9. The semiconductor integrated circuit according to claim 8, further comprising a second switch circuit provided between said amplitude limiting circuit and said data line differential amplifier circuit.

10. The semiconductor integrated circuit according to claim 8, wherein said first and second data lines are respectively connected to third and fourth data lines through connecting terminals;

said third and fourth data lines comprise a second data line differential amplifier circuit for amplifying a potential difference between said third and fourth data lines; and said second data line differential amplifier circuit comprises a current mirror type differential amplifier circuit which functions as a switch circuit for respectively switching over a connection of said first and third data lines and a connection of second and fourth data lines, said second data line differential amplifier circuit comprising a pair of transistors coupled to receive output signals at gate electrodes of the transistors.

11. A semiconductor integrated circuit comprising:

at least one memory cell having a first transistor of a first conductive type having a gate, a source and a drain, the memory cell further having a capacitor connected between the source of the first transistor and a power source;

a word line connected to the gate of the first transistor;

at least one bit line pair, the pair having a first and a second bit line, the first bit line connected to the drain of the first transistor;

a first and second data line;

at least one first pair of transistors of the first conductive type connected in series to each other and connected to the bit lines;

at least one first pair of transistors of a second conductive type connected in series to each other and connected to the bit lines and to the first transistor pair of the first conductive type to form a bit line differential amplifier that amplifies a potential difference between the bit lines;

at least one second pair of transistors of the first conductive type, one of the transistors in the second transistor pair of the first conductive type having a source connected to the first bit line and a drain connected to the first data line, the other of the transistors in the second transistor pair of the first conductive type having a source connected to the second bit line and a drain connected to the second data line, the second transistor pair of the first conductive type having gates connected to each other to which a first control signal is applied, the second transistor pair of the first conductive type, in response to the first control signal, transferring the potential difference between the bit lines amplified by the differential amplifier to the data lines;

a second transistor of the first conductive type having a drain connected to the first data line, a source connected to the second data line and a gate to which a second control signal is applied, wherein the second transistor of the first conductive type forms an amplitude limiting circuit, and in response to the second control signal, maintains the potential difference between the data lines at a threshold level of the second transistor or more; and a second pair of transistors of the second conductive type having sources connected to the power source, a drain of one of the second pair of transistors of the second conductive type being connected to the first data line and a drain of the other of the second transistor pair of the second conductive type being connected to the second data line, and gates of the second transistor pair of the second conductive type being supplied a third control signal, wherein the second transistor pair of the second conductive type, in response to the third control signal, equalizes the data lines by charging the data lines to a predetermined potential, wherein the second control signal is set such that the second transistor of the first conductive type maintains the potential difference between the data lines at least during part of a time period when the second pair of transistors of the second conductive type is turned off to prevent the equalizing of the data lines.

12. A semiconductor integrated circuit according to claim 11, wherein the first and second transistors of the first conductive type and the first and second pair of transistors of the first conductive type are N channel metal oxide semiconductor (NMOS) transistors, and the first and second pair of transistors of the second conductive type are P channel metal oxide semiconductor (PMOS) transistors.

13. A semiconductor integrated circuit according to claim 11 further comprising a first and a second inverter connected to the drain and the source of the second transistor, wherein first and second write data are applied via the first and second inverters to the first and second data lines, respectively.

14. A semiconductor integrated circuit according to claim 11 further comprising a third pair of transistors of the second conductive type having sources connected to the power source, a drain of one of the third transistor pair of the second conductive type being connected to the first data line and another drain of the other of the third transistor pair of the second conductive type being connected to the second data line, and gates of the third transistor pair of the second conductive type being supplied with a fourth control signal, the third transistor pair of the second conductive type being operative for a predetermined time period in response to the fourth control signal to shorten a charging operation of the first and second data lines.

15. A semiconductor integrated circuit according to claim 11 further comprising:

a third pair of transistors having one transistor of the first conductive type and one transistor of the second conductive type connected in series to each other and to the first data line at a series connection point of the third transistor pair; and a fourth pair of transistors having one transistor of the first conductive type and one transistor of the second conductive type connected in series to each other and to the second line at a series connection point of the fourth transistor pair, wherein the third and fourth transistor pairs form a data line differential amplifier that amplifies the potential difference between the data lines.

16. A semiconductor integrated circuit according to claim 15 further comprising a fourth pair of transistors of the second conductive type, the first transistor pair of the first and second conductive types connected to the first data line via one of the fourth transistor pair, the second transistor pair of the first and second conductive types connected to the second data line via the other of the fourth transistor pair, the fourth transistor pair transferring the potential difference of the data to the data line differential amplifier in response to a fourth control signal.

17. A semiconductor integrated circuit comprising:

a memory cell array having a plurality of memory cells operating at a power source potential;

a plurality of bit line pairs, each having a first and a second bit line and connected to one of the memory cells;

a first and a second data line connected to the first and second bit lines, respectively, via a differential amplifier;

a limiting circuit consisting of one metal oxide semiconductor (MOS) transistor, responsive to a first control signal, for keeping a potential difference between the data lines induced by the differential amplifier at a threshold level of the MOS transistor or more but lower than the power source potential, the limiting circuit operating while the differential amplifier is activated; and means, responsive to a second control signal, for equalizing the data lines by charging the data lines to a predetermined potential, wherein the limiting circuit operates to limit the potential difference between the data lines at least during part of a time period when the means for equalizing is turned off to prevent the equalizing of the data lines.

18. A semiconductor integrated circuit comprising:

at least one memory cell operating at a power source potential;

at least one bit line differential amplifier connected to the memory cell via a bit line pair, the bit line differential amplifier generating a first potential difference by amplifying a first potential difference on the bit line pair;

a first switch connected to the differential amplifier via the bit line pair, the first switch transferring the amplified first potential difference to a data line pair;

a limiting circuit consisting of an N channel metal oxide semiconductor (NMOS) transistor having a source directly connected to one of the data line pair, a drain directly connected to the other of the data line pair, and a gate to which a control signal is applied, said limiting circuit limiting a second potential difference ($V_2$) between the data line pair to a threshold level ($V_{th}$) of the NMOS transistor or more but lower than the power source potential ($V_{th} \leq V_2 < V_{cc}$);

a second switch connected to the limiting circuit via the data line pair, the second potential difference being transferred via the second switch; and an equalizer connected to the second switch via the data line pair, the equalizer equalizing the data line pair, wherein the limiting circuit operates to limit the second potential difference between the data line pair at least during part of a time period when the equalizer is turned off to prevent the equalizing of the data line pair.

19. A dynamic random access memory having a plurality of memory cells, data stored in one of the memory cells being amplified and transferred from a bit line pair to a data line pair, the dynamic random access memory comprising:

an amplitude limiting circuit consisting of an N channel metal oxide semiconductor (NMOS) transistor having a source directly connected to one of the data line pair, a drain directly connected to the other of the data line pair and a gate to which a first control signal is applied, the NMOS transistor keeping a potential difference between the data lines at a threshold level of the NMOS transistor or more in response to the first control signal; and a pair of P channel metal oxide semiconductor (PMOS) transistors having sources connected to a power source, a drain of one of the PMOS transistors being connected to one of the data line pair, a drain of the other of the PMOS transistors being connected to the other of the data line pair, the pair of PMOS transistors equalizing the data line pair by charging to a potential supplied by the power source the data line pair whose potential difference remains at the threshold level of the NMOS transistor or more, wherein the first control signal is set such that the amplitude limiting circuit operates to limit the potential difference between the data lines during at least part of an active operating cycle of the dynamic random access memory, and during at least part of a time period when the pair of PMOS transistors is turned off to prevent the equalizing of the data line pair.

20. In a semiconductor memory device of the type having:

a plurality of memory cells, a plurality of bit line pairs, each having a first and a second bit line, either the first or the second bit line, or both the first and second bit lines being connected to one of the memory cells, a plurality of differential amplifiers connected between the first and second bit lines, a first and a second data line selectively coupled to the first and second bit lines via coupling means, and equalizing means, responsive to a first control signal, for equalizing the data lines by charging the data lines to a predetermined potential, the improvement which comprises:

an amplitude limiting circuit consisting of one transistor having a current path and a control electrode, the current path of the transistor being directly connected between the first and second data lines, and the control electrode of the transistor receiving a second control signal, for limiting a potential difference between the first and second data lines to a threshold level of the transistor or more in response to the second control signal, wherein the second control signal is set such that the amplitude limiting circuit operates to limit the potential difference between the first and second data lines at least during part of a time period when the equalizing means is turned off to prevent the equalizing of the data lines.

21. The semiconductor memory device according to claim 20, wherein the second control signal activates the amplitude limiting circuit to limit the potential difference between the first and second data lines during at least substantially all of an active operating cycle of the semiconductor memory device.

22. The semiconductor memory device according to claim 20, wherein said one transistor consists of an N-channel MOS (NMOS) transistor.

23. The semiconductor memory device according to claim 20, wherein said one transistor consists of a P-channel MOS (PMOS) transistor.

24. A semiconductor memory device comprising:

a memory cell matrix having:
a plurality of memory cells arranged in matrix;
a plurality of word lines, each word line being connected to a row of memory cells in the memory cell matrix; and
a plurality of bit line pairs each having a first bit line and a second bit line, each bit line pair being connected to a column of memory cells from the memory cell matrix;

a first data line pair having a first data line and a second data line, the first bit lines of the bit line pairs being selectively coupled to the first data line and the second bit lines of the bit line pairs being selectively coupled to the second data line;

a first means for precharging the first and the second data lines to a first potential (V);

a first N channel field effect transistor (NFET) directly connected between the first and the second data lines, the first NFET having a threshold voltage (Vth) and including a gate electrode; and a second means for supplying a second potential to the gate electrode of the first NFET for making the first NFET conductive at least during part of a time period when the first means is turned off to prevent the precharging of the first and the second data lines, the second potential being a maximum voltage level ($\phi1_{max}$) that is less than the sum of the first potential and the threshold voltage of the first NFET ($\phi1_{max}$<V+Vth).

25. A semiconductor memory device comprising:

a memory cell matrix having:
a plurality of memory cells arranged in matrix;
a plurality of word lines, each word line being connected to a row of memory cells in the memory cell matrix; and
a plurality of bit line pairs each having a first bit line and a second bit line, each bit line pair being connected to a column of memory cells from the memory cell matrix;

a first data line pair having a first data line and a second data line, the first bit lines of the bit line pairs being selectively coupled to the first data line and the second bit lines of the bit line pairs being selectively coupled to the second data line;

a first means for precharging the first and the second data lines to a first potential (V);

a first N channel field effect transistor (NFET) directly connected between the first and the second data lines, the first NFET having a threshold voltage (Vth) and including a gate electrode; and a second means for supplying a second potential to the gate electrode of the first NFET for making the first NFET conductive at least while the first data line pair is being sensed, the second potential being a maximum voltage level ($\phi1_{max}$) that is less than the sum of the first potential and the threshold voltage of the first NFET ($\phi1_{max}$<V+Vth), wherein in a first predetermined period, the first means precharges the first and the second data lines to the first potential and the second means supplies the second potential to the gate electrode of the first NFET, and in a second predetermined period that follows the first predetermined period, the first means is turned off to discontinue the precharging of the first and the second data lines, while the second means continues to supply the second potential to the gate electrode of the first NFET.

26. The semiconductor memory device as defined in claim 25, wherein the first means includes:

a first P channel field effect transistor (PFET) connected between the first and the second data lines;

a second PFET connected between the first data line and a power supply terminal, the power supply terminal supplying the first potential to the second PFET; and a third PFET connected between the second data line and the power supply terminal, the power supply terminal supplying the first potential to the third PFET, wherein gate electrodes of the first, the second, and the third PFETs are connected together.

27. The semiconductor memory device as defined in claim 25, wherein the first and the second potentials are equal.

28. The semiconductor memory device as defined in claim 25, further comprising an amplifier for amplifying a potential difference between the first and the second data lines, the amplifier being activated in the second predetermined period.

29. The semiconductor memory device as defined in claim 24, wherein the first means includes:

a first P channel field effect transistor (PFET) connected between the first and the second data lines;

a second PFET connected between the first data line and a power supply terminal, the power supply terminal supplying the first potential to the second PFET; and a third PFET connected between the second data line and the power supply terminal, the power supply terminal supplying the first potential to the third PFET, wherein gate electrodes of the first, the second, and the third PFETs are connected together.

30. The semiconductor memory device as defined in claim 24, wherein the first and the second potentials are equal.

31. The semiconductor memory device as defined in claim 27, further comprising an amplifier for amplifying a potential difference between the first and the second data lines.

32. The semiconductor memory as defined in claim 25, further comprising:

a second data line pair having a third data line and a fourth data line, the third data line being coupled to the first data line and the fourth data line being coupled to the second data line in response to a control signal; and a third means for precharging the third and the fourth data lines to the first potential, wherein the third means precharges the third and the fourth data lines before the third and fourth data lines are coupled to the first and second data lines, respectively.

33. The semiconductor memory device as defined in claim 32, wherein the third means includes:

a first P-channel field effect transistor (PFET) connected between the third and the fourth data lines;

a second PFET connected between the third data line and a power supply terminal, the power supply terminal supplying the first potential to the second PFET; and a third PFET connected between the fourth data line and the power supply terminal, the power supply terminal supplying the first potential to the third PFET, wherein gate electrodes of the first, the second, and the third PFETs are connected together.

34. The semiconductor memory device as defined in claim 24, further comprising an amplifier for amplifying a potential difference between the first and the second data lines.

35. The semiconductor memory device as defined in claim 28, wherein the amplifier includes:

a first pair of transistors having one NFET and one P channel field effect transistor (PFET); and a second pair of transistors having one NFET and one PFET, wherein the NFET and the PFET of each pair of transistors are connected in series between a power supply terminal and a ground terminal, gates of the NFET and the PFET of the first pair of transistors being connected to the second data line and to a series connection point of the second pair of transistors, and gates of the NFET and the PFET of the second pair of transistors being connected to the first data line and to a series connection point of the first pair of transistors.

36. A method for controlling a semiconductor memory, the semiconductor memory of the type having:

a memory cell matrix including a plurality of memory cells arranged in matrix, word lines each connected to a row of memory cells in the memory cell matrix, and bit line pairs each connected to a column of memory cells in the memory cell matrix;

a first data line pair having a first data line and a second data line, the bit line pairs being selectively coupled to the first data line pair;

a precharging circuit; and a first N channel field effect transistor (NFET) directly connected between the first and the second data lines, the first NFET having a threshold voltage (Vth), the method comprising the steps of:

precharging the first and the second data lines to a first potential (V);

supplying a second potential ($\phi 1_{max}$) to a gate electrode of the first NFET for making the first NFET conductive at least while the first data line pair is being sensed, the second potential being less than the sum of the first potential and the threshold voltage of the first NFET ($\phi 1_{max} < V + Vth$); and discontinuing the precharging of the first and the second data lines, while continuing to supply the second potential to the gate electrode of the first NFET.

37. The method for controlling a semiconductor memory as defined in claim 36, wherein the first and the second potentials are equal so that the first NFET operates to limit a potential difference between the first and second data lines to the threshold voltage (Vth) of the first NFET or more while the gate electrode of the first NFET is receiving the second potential.

38. The method for controlling a semiconductor memory as defined in claim 37, further comprising the step of:

amplifying a potential difference between the first and the second data lines, while continuing to supply the second potential to the gate electrode of the first NFET.

39. The method for controlling a semiconductor memory as defined in claim 36, further comprising the steps of:

precharging a second data line pair, which has a third data line and a fourth data line, to the first potential; and coupling the second data line pair to the first data line pair in response to a control signal, the third data line being coupled to the first data line and the fourth data line being coupled to the second data line.

40. The method for controlling a semiconductor memory as defined in claim 36, further comprising the step of:

amplifying a potential difference between the first and the second data lines, while continuing to supply the second potential to the gate electrode of the first NFET.

41. A semiconductor memory device comprising:

a memory cell matrix including:

a plurality of memory cells arranged in matrix; and a plurality of bit line pairs, each bit line pair being connected to memory cells from the memory cell matrix;

a first data line pair having a first data line and a second data line, the bit line pairs being selectively coupled to the first data line pair;

a precharging means for precharging the first and the second data lines to a first potential (V); and a limiting circuit consisting of one limiting transistor directly connected between the first data line and the second data line, the limiting transistor having a threshold voltage (Vth) and a gate electrode, wherein a control signal is supplied to the gate electrode of the limiting transistor, one of the bit line pairs is coupled to the first data line pair during an output period of a memory read cycle, the control signal is held at a second potential ($\phi1_{max}$) during the entire output period to keep the limiting circuit activated during the entire output period, thereby limiting the potential difference between the first data line and the second data line to the threshold voltage of the limiting transistor or more during the output period, and the precharging means is turned off to prevent the precharging of the first and the second data lines during at least part of the output period.

42. The semiconductor memory device as defined in claim 41, further comprising an amplifier for amplifying a potential difference between the first and the second data lines, the amplifier being activated during at least part of the output period of a memory read cycle.

43. The semiconductor memory device as defined in claim 41, wherein the limiting transistor is a P channel field effect transistor (PFET), and the second potential is less than the sum of a gate ground potential ($V_{GND}$) and the first potential, less the threshold voltage of the limiting transistor ($\phi1_{max} < V_{GND} + V - Vth$).

44. The semiconductor memory device as defined in claim 41, wherein the limiting transistor is an N channel field effect transistor (NFET), and the second potential is less than the sum of the first potential and the threshold voltage of the limiting transistor ($\phi1_{max} < V + Vth$).

45. The semiconductor memory device as defined in claim 44, wherein the precharging means includes:

a first P channel field effect transistor (PFET) connected between the first and the second data lines;

a second PFET connected between the first data line and a power supply terminal, the power supply terminal supplying the first potential to the second PFET; and a third PFET connected between the second data line and the power supply terminal, the power supply terminal supplying the first potential to the third PFET, wherein gate electrodes of the first, the second, and the third PFETs are connected together.

46. The semiconductor memory device as defined in claim 44, wherein the first and the second potentials are equal.

47. The semiconductor memory device as defined in claim 44, further comprising an amplifier for amplifying a potential difference between the first and the second data lines, the amplifier being activated during at least part of the output period of a memory read cycle.

48. The semiconductor memory as defined in claim 41, further comprising:

a second data line pair having a third data line and a fourth data line, the third data line being coupled to the first data line and the fourth data line being coupled to the second data line during the output period of a memory read cycle; and a second means for precharging the third and the fourth data lines to the first potential, wherein the second means for precharging precharges the third and the fourth data lines before the third and fourth data lines are coupled to the first and second data lines, respectively.

49. The semiconductor memory device as defined in claim 48, further comprising an amplifier for amplifying a potential difference between the first and the second data lines, the amplifier being activated during at least part of the output period of a memory read cycle.

50. The semiconductor integrated circuit as defined in claim 1, wherein the gate potential of the NMOS transistor is set such that the NMOS transistor is conductive at least during substantially the entire period that the data line differential amplifier circuit is activated.

51. The semiconductor integrated circuit as defined in claim 1, wherein the gate potential of the NMOS transistor is set to a power source potential to make the NMOS transistor conductive while the data line differential amplifier circuit is activated and during at least part of the time period when the first and second data lines are not being precharged to and equalized at a precharge potential.

52. The semiconductor integrated circuit as defined in claim 1, wherein the gate potential of the NMOS transistor is always at a power source potential.

53. The semiconductor integrated circuit as defined in claim 1, further comprising an equalizer connected between the first and second data lines to selectively equalize the data line pair at an equalization potential.

54. The semiconductor integrated circuit as defined in claim 8, wherein the gate potential of the NMOS transistor is always at a power source potential.

55. The semiconductor integrated circuit as defined in claim 8, further comprising an equalizer connected between the first and second data lines to selectively equalize the data line pair at an equalization potential.

56. The semiconductor integrated circuit as defined in claim 11, wherein the second control signal is set to a power source potential to make the second transistor of the first conductive type maintain the potential difference between the data lines during part of the time period when the second pair of transistors of the second conductive type is turned off, and the predetermined potential is equal to the power source potential.

57. The semiconductor integrated circuit as defined in claim 11, wherein in response to the second control signal, the amplitude limiting circuit maintains the potential difference between the data lines at the threshold level of the second transistor.

58. The semiconductor integrated circuit as defined in claim 11, further comprising a second transistor of the second conductive type having a source connected to the first data line, a drain connected to the second data line, and a gate to which the third control signal is applied, wherein the second transistor pair of the second conductive type and the second transistor of the second conductive type, in response to the third control signal, equalizes the data lines by charging and equalizing the data lines to the predetermined potential.

59. The semiconductor integrated circuit as defined in claim 17, wherein the limiting circuit operates to limit the potential difference between the data lines at least during substantially the entire period that the differential amplifier is activated, and the predetermined potential is equal to the power source potential.

60. The semiconductor integrated circuit as defined in claim 17, wherein the first control signal is always at the power source potential.

61. The semiconductor integrated circuit as defined in claim 18, wherein the control signal is set to the power source potential to make the limiting circuit operate to limit the second potential difference between the data line pair during at least part of the time period when the equalizer is turned off.

62. The semiconductor integrated circuit as defined in claim 18, wherein the control signal is always at the power source potential.

63. The dynamic random access memory as defined in claim 19, wherein the amplitude limiting circuit operates to limit the potential difference between the data lines at least during substantially the entire active operating cycle of the dynamic random access memory.

64. The dynamic random access memory as defined in claim 19, wherein the first control signal is set to the power source potential to make the amplitude limiting circuit operate to limit the potential difference between the data lines during at least part of the active operating cycle, and during at least part of the time period when the pair of PMOS transistors is turned off.

65. The dynamic random access memory as defined in claim 19, wherein the first control signal is set to the power source potential throughout an entire operating cycle of the dynamic random access memory.

66. The dynamic random access memory as defined in claim 19, wherein the NMOS transistor keeps the potential difference between the data lines at the threshold level of the NMOS transistor in response to the first control signal.

67. The dynamic random access memory as defined in claim 19, further comprising a third PMOS transistor, the source of the third PMOS transistor being connected to one of the data line pair and the drain of the third PMOS transistor being connected to the other of the data line pair, wherein the pair of PMOS transistors and the third PMOS transistor equalizes the data line pair at a potential supplied by the power source.

68. The semiconductor memory device according to claim 20,
wherein the second control signal is set to a power source potential to make the amplitude limiting circuit operate to limit the potential difference between the first and second data lines during at least part of the time period when the equalizing means is turned off, and
the predetermined potential is equal to the power source potential.

69. The semiconductor memory device as defined in claim 24, wherein second means supplies the second potential to the gate electrode of the first NFET during at least substantially the entire period that the first data line pair is being sensed.

70. The semiconductor memory device as defined in claim 24, wherein the first and second potentials are equal to a power source potential.

71. The semiconductor memory device as defined in claim 24, wherein the second means supplies a power source potential to the gate electrode of the first NFET throughout an entire operating cycle of the semiconductor memory device.

72. The method as defined in claim 36, wherein the second potential is supplied to the gate electrode of the first NFET during at least substantially the entire period that the first data line pair is being sensed.

73. The method as defined in claim 36, wherein the first and second potentials are equal to a power source potential.

74. The method as defined in claim 36, wherein a power source potential is supplied to the gate electrode of the first NFET throughout an entire operating cycle of the semiconductor memory.

75. The method as defined in claim 36,
wherein the step of precharging includes both precharging and equalizing the first and the second data lines to the first potential, and
the step of discontinuing the precharging includes discontinuing both precharging and equalizing of the first and the second data lines.

76. The semiconductor memory device as defined in claim 41, wherein the first and second potentials are equal to a power source potential.

77. The semiconductor memory device as defined in claim 41, wherein the control signal is held at a power source potential throughout an entire operating cycle of the semiconductor memory device.

78. A semiconductor integrated circuit for reading data in memory cells comprising:
a memory cell matrix having dynamic random access memory (DRAM) cells arranged in a plurality of rows and a plurality of columns along two directions which are at right angles to each other;
a plurality of word lines each arranged at one row of said plurality of rows of said cell matrix;
a plurality of bit line pairs which have a pair of bit lines arranged at each column of said plurality of bit line pairs of said cell matrix, and each pair of which has a first and a second bit line for reading said data;
A plurality of bit line differential amplifier circuits, each of which is provided for each pair of the plurality of said bit line pairs and amplifies a potential difference between said first and second bit lines;
a pair of data lines having a first data line coupled to the plurality of said first bit lines and a second data line coupled to the plurality of said second bit lines;
a first switch circuit, provided between the plurality of said bit line differential amplifier circuits of each pair of the plurality of pairs of said bit lines and said pair of data lines, for turning on and off a charge transmission from each of said bit line pairs to said data line pair;
a data line differential amplifier circuit for amplifying the potential difference between said data line pair; and
an amplitude limiting circuit consisting of an N channel metal oxide semiconductor (NMOS) transistor which has a source electrode directly connected to one of said first and second data lines, a drain electrode directly connected to the other of said first and second data lines, and a gate electrode having a gate potential set such that the NMOS transistor is conductive when the potential difference between said first and second data lines becomes a predetermined regulated value while the data line differential amplifier circuit is activated, thereby limiting an amplitude between said first and second data lines to less than said predetermined regulated value by conduction of said transistor,
wherein in a first predetermined period, the first and second data lines are precharged to a precharge potential, and
in a second predetermined period that follows the first predetermined period, the precharging of the first and second data lines is discontinued, and the NMOS transistor is conductive.

79. The semiconductor integrated circuit as defined in claim 78, wherein in the first predetermined period, the NMOS transistor is conductive.

80. The semiconductor integrated circuit as defined in claim 78, wherein in the first predetermined period, the NMOS transistor is not conductive.

81. A semiconductor integrated circuit for reading data in memory cells comprising:
- a memory cell matrix having memory cells arranged in a plurality of rows and a plurality of columns along two directions which are at right angles to each other;
- a plurality of word lines each arranged at one row of said cell matrix;
- a plurality of bit line pairs which have a pair of bit lines arranged at each column of said cell matrix, and each pair of which has a first and second bit line for reading said data;
- a plurality of bit line differential amplifier circuits, each of which is provided for each pair of the plurality of said bit line pairs and amplifies a potential difference between said first and second bit lines;
- a pair of data lines having a first data line connected to the plurality of said first bit lines and a second data line connected to the plurality of said second bit lines;
- a first switch circuit, provided between the plurality of said bit line differential amplifier circuits of each pair of the plurality of pairs of said bit lines and said pair of data lines;
- a data line differential amplifier circuit for amplifying the potential difference between said data line pair and for generating complimentary signals having a first signal and a second signal; and
- an amplitude limiting circuit consisting of an N channel metal oxide semiconductor (NMOS) transistor which has a source electrode directly connected to one of said first and second data lines, a drain electrode directly connected to the other of said first and second data lines, and a gate electrode having a gate potential set such that the NMOS transistor is conductive when the potential difference between said first and second data line becomes a predetermined regulated value while the data line differential amplifier circuit is activated, said amplitude limiting circuit limiting an amplitude between said first and second data lines to less than said predetermined regulated value, said predetermined regulated value being smaller than a voltage difference between said first and second signals,
- wherein in a first predetermined period, the first and second data lines are precharged to a precharge potential, and
- in a second predetermined period that follows the first predetermined period, the precharging of the first and second data lines is discontinued, and the NMOS transistor is conductive.

82. The semiconductor integrated circuit as defined in claim 81, wherein in the first predetermined period, the NMOS transistor is conductive.

83. The semiconductor integrated circuit as defined in claim 81, wherein in the first predetermined period, the NMOS transistor is not conductive.

84. A semiconductor integrated circuit comprising:
- at least one memory cell having a first transistor of a first conductive type having a gate, a source and a drain, the memory cell further having a capacitor connected between the source of the first transistor and a power source;
- a word line connected to the gate of the first transistor;
- at least one bit line pair, the pair having a first and a second bit line, the first bit line connected to the drain of the first transistor;
- a first and second data line;
- at least one first pair of transistors of the first conductive type connected in series to each other and connected to the bit lines;
- at least one first pair of transistors of a second conductive type connected in series to each other and connected to the bit lines and to the first transistor pair of the first conductive type to form a bit line differential amplifier that amplifies a potential difference between the bit lines;
- at least one second pair of transistors of the first conductive type, one of the transistors in the second transistor pair of the first conductive type having a source connected to the first bit line and a drain connected to the first data line, the other of the transistors in the second transistor pair of the first conductive type having a source connected to the second bit line and a drain connected to the second data line, the second transistor pair of the first conductive type having gates connected to each other to which a first control signal is applied, the second transistor pair of the first conductive type, in response to the first control signal, transferring the potential difference between the bit lines amplified by the differential amplifier to the data lines;
- a second transistor of the first conductive type having a drain connected to the first data line, a source connected to the second data line and a gate to which a second control signal is applied, wherein the second transistor of the first conductive type forms an amplitude limiting circuit, and in response to the second control signal, maintains the potential difference between the data lines at a threshold level of the second transistor or more; and
- a second pair of transistors of the second conductive type having sources connected to the power source, a drain of one of the second pair of transistors of the second conductive type being connected to the first data line and a drain of the other of the second transistor pair of the second conductive type being connected to the second data line, and gates of the second transistor pair of the second conductive type being supplied a third control signal, wherein the second transistor pair of the second conductive type, in response to the third control signal, equalizes the data lines by charging the data lines to a predetermined potential,
- wherein in a first predetermined period, the data lines are equalized at the predetermined potential, and
- in a second predetermined period that follows the first predetermined period, the equalizing of the data lines is discontinued, and the second transistor of the first conductive type operates to limit the potential difference between the data lines.

85. The semiconductor integrated circuit as defined in claim 84, wherein the first predetermined period the second transistor of the first conductive type operates to limit the potential difference between the data lines.

86. The semiconductor integrated circuit as defined in claim 84, wherein in the first predetermined period the second transistor of the first conductive type does not operate to limit the potential difference between the data lines.

87. A semiconductor integrated circuit comprising:
- a memory cell array having a plurality of memory cells operating at a power source potential;
- a plurality of bit line pairs, each having a first and a second bit line and connected to one of the memory cells;

a first and a second data line connected to the first and second bit lines, respectively, via a differential amplifier;

a limiting circuit consisting of one metal oxide semiconductor (MOS) transistor, responsive to a first control signal, for keeping a potential difference between the data lines induced by the differential amplifier at a threshold level of the MOS transistor or more but lower than the power source potential; and means, responsive to a second control signal, for equalizing the data lines by charging the data lines to a predetermined potential, wherein in a first predetermined period, the means for equalizing equalizes the data lines, and in a second predetermined period that follows the first predetermined period, the means for equalizing is turned off to discontinue the equalization of the data lines, and the MOS transistor operates to limit the potential difference between the data lines.

88. The semiconductor integrated circuit as defined in claim 87, wherein in the first predetermined period, the MOS transistor operates to limit the potential difference between the data lines.

89. The semiconductor integrated circuit as defined in claim 87, wherein in the first predetermined period, the MOS transistor does not operate to limit the potential difference between the data lines.

90. A semiconductor integrated circuit comprising:

at least one memory cell operating at a power source potential;

at least one bit line differential amplifier connected to the memory cell via a bit line pair, the bit line differential amplifier generating a first potential difference by amplifying a first potential difference on the bit line pair;

a first switch connected to the differential amplifier via the bit line pair, the first switch transferring the amplified first potential difference to a data line pair;

a limiting circuit consisting of an N channel metal oxide semiconductor (NMOS) transistor having a source directly connected to one of the data line pair, a drain directly connected to the other of the data line pair, and a gate to which a control signal is applied, said limiting circuit limiting a second potential difference ($V_2$) between the data line pair to a threshold level ($V_{th}$) of the NMOS transistor or more but lower than the power source potential ($V_{th} \leq V_2 < V_{cc}$);

a second switch connected to the limiting circuit via the data line pair, the second potential difference being transferred via the second switch; and an equalizer connected to the second switch via the data line pair, the equalizer equalizing the data line pair by charging to the power source potential the data line pair, wherein in a first predetermined period, the equalizer equalizes the data line pair, and in a second predetermined period that follows the first predetermined period, the equalizer is turned off to discontinue the equalization of the data line pair, and the limiting circuit limits the second potential difference between the data line pair.

91. The semiconductor integrated circuit as defined in claim 90, wherein in the first predetermined period, the limiting circuit limits the second potential difference between the data line pair.

92. The semiconductor integrated circuit as defined in claim 90, wherein in the first predetermined period, the limiting circuit does not limit the second potential difference between the data line pair.

93. A dynamic random access memory having a plurality of memory cells, data stored in one of the memory cells being amplified and transferred from a bit line pair to a data line pair, the dynamic random access memory comprising:

an amplitude limiting circuit consisting of an N channel metal oxide semiconductor (NMOS) transistor having a source directly connected to one of the data line pair, a drain directly connected to the other of the data line pair and a gate to which a first control signal is applied, the NMOS transistor keeping a potential difference between the data lines at a threshold level of the NMOS transistor or more in response to the first control signal; and a pair of P channel metal oxide semiconductor (PMOS) transistors having sources connected to a power source, a drain of one of the PMOS transistors being connected to one of the data line pair, a drain of the other of the PMOS transistors being connected to one of the data line pair, a drain of the other of the PMOS transistors being connected to the other of the data line pair, the pair of PMOS transistors equalizing the data line pair by charging to a potential supplied by the power source the data line pair whose potential difference remains at the threshold level of the NMOS transistor or more, wherein in a first predetermined period, the data line pair is equalized by the pair of PMOS transistors, and in a second predetermined period that follows the first predetermined period, the equalization of the data line pair is discontinued, while the amplitude limiting circuit operates to limit the potential difference between the data lines.

94. The dynamic random access memory as defined in claim 93, wherein in the first predetermined period, the amplitude limiting circuit operates to limit the potential difference between the data lines.

95. The dynamic random access memory as defined in claim 93, wherein in the first predetermined period, the amplitude limiting circuit does not operate to limit the potential difference between the data lines.

96. In a semiconductor memory device of the type having:

a plurality of memory cells, a plurality of bit line pairs, each having a first and a second bit line, either the first or the second bit line, or both the first and second bit lines being connected to one of the memory cells, a plurality of differential amplifiers connected between the first and second bit lines, a first and a second data line selectively coupled to the first and second bit lines via coupling means, and equalizing means, responsive to a first control signal, for equalizing the data lines by charging the data lines to a predetermined potential, the improvement which comprises:

an amplitude limiting circuit consisting of one transistor having a current path and a control electrode, the current path of the transistor being directly connected between the first and second data lines, and the control electrode of the transistor receiving a second control signal, for limiting a potential difference between the first and second data lines to a threshold level of the transistor or more in response to the second control signal, wherein in a first predetermined period, the first control signal is active so that the equalizing means equalizes the data lines, and in a second predetermined period that follows the first predetermined period, the second control signal is inactive so that the equalizing means does not equalize the data lines, and the second control signal is at a level that causes the amplitude limiting circuit to limit the potential difference between the first and second data lines.

97. The semiconductor memory device as defined in claim 96, wherein in the first predetermined period, the second control signal is at a level that causes the amplitude limiting circuit to limit the potential difference between the first and second data lines.

98. The semiconductor memory device as defined in claim 96, wherein in the first predetermined period, the second control signal is at a level that prevents the amplitude limiting circuit from limiting the potential difference between the first and second data lines.

99. A semiconductor memory device comprising:

a memory cell matrix having:
- a plurality of memory cells arranged in matrix;
- a plurality of word lines, each word line being connected to a row of memory cells in the memory cell matrix; and
- a plurality of bit line pairs each having a first bit line and a second bit line, each bit line pair being connected to a column of memory cells from the memory cell matrix;

a first data line pair having a first data line and a second data line, the first bit lines of the bit line pairs being selectively coupled to the first data line and the second bit lines of the bit line pairs being selectively coupled to the second data line;

a first means for precharging the first and the second data lines to a first potential (V);

a first N channel field effect transistor (NFET) directly connected between the first and the second data lines, the first NFET having a threshold voltage (Vth) and including a gate electrode; and a second means for supplying a second potential to the gate electrode of the first NFET for making the first NFET conductive at least while the first data line pair is being sensed, the second potential being a maximum voltage level ($\phi1_{max}$) that is less than the sum of the first potential and the threshold voltage of the first NFET ($\phi1_{max}<V+Vth$), wherein in a first predetermined period, the first means precharges the first and the second data lines to the first potential and the second means does not supply the second potential to the gate electrode of the first NFET, and in a second predetermined period that follows the first predetermined period, the first means is turned off to discontinue the precharging of the first and the second data lines, and the second means supplies the second potential to the gate electrode of the first NFET.

100. A method for controlling a semiconductor memory, the semiconductor memory of the type having:

a memory cell matrix including a plurality of memory cells arranged in matrix, word lines each connected to a row of memory cells in the memory cell matrix, and bit line pairs each connected to a column of memory cells in the memory cell matrix;

a first data line pair having a first data line and a second data line, the bit line pairs being selectively coupled to the first data line pair;

a precharging circuit; and a first N channel field effect transistor (NFET) directly connected between the first and the second data lines, the first NFET having a threshold voltage (Vth), the method comprising the steps of:

precharging the first and the second data lines to a first potential (V); and supplying a second potential ($\phi1_{max}$) to a gate electrode of the first NFET for making the first NFET conductive at least while the first data line pair is being sensed, the second potential being less than the sum of the first potential and the threshold voltage of the first NFET ($\phi1_{max}<V+Vth$), wherein in a first predetermined period, the first and the second data lines are precharged, and in a second predetermined period that follows the first predetermined period, the first and second data lines are not precharged, and the second potential is supplied to the gate electrode of the first NFET.

101. The method as defined in claim 100, wherein in the first predetermined period, the second potential is supplied to the gate electrode of the first NFET.

102. The method as defined in claim 100, wherein in the first predetermined period, the second potential is not supplied to the gate electrode of the first NFET.

103. A semiconductor memory device comprising:

a memory cell matrix including:
- a plurality of memory cells arranged in matrix; and
- a plurality of bit line pairs, each bit line pair being connected to memory cells from the memory cell matrix;

a first data line pair having a first data line and a second data line, the bit line pairs being selectively coupled to the first data line pair;

a precharging means for precharging the first and the second data lines to a first potential (V); and a limiting circuit consisting of one limiting transistor directly connected between the first data line and the second data line, the limiting transistor having a threshold voltage (Vth) and a gate electrode, wherein a control signal is supplied to the gate electrode of the limiting transistor, before a predetermined period, the precharging means precharges the data lines, and during the predetermined period:

the precharging means does not precharge the data lines;

one of the bit line pairs is coupled to the first data line pair; and the control signal is held at a second potential ($\phi1_{max}$) to keep the limiting circuit activated, thereby limiting the potential difference between the first data line and the second data line to the threshold voltage of the limiting transistor or more during the predetermined period.

104. The semiconductor memory device as defined in claim 103, wherein before the predetermined period and while the precharging means precharges the data lines, the control signal is held at the second potential to keep the limiting circuit activated.

105. The semiconductor memory device as defined in claim 103, wherein before the predetermined period and while the precharging means precharges the data lines, the control signal is not held at the second potential.

106. A semiconductor integrated circuit for reading data in memory cells comprising:

a memory cell matrix having dynamic random access memory (DRAM) cells arranged in a plurality of rows and a plurality of columns along two directions which are at right angles to each other;

a plurality of word lines each arranged at one row of said plurality of rows of said cell matrix;

a plurality of bit line pairs which have a pair of bit lines arranged at each column of said plurality of bit line pairs of said cell matrix, and each pair of which has a first and a second bit line for reading said data;

a plurality of bit line differential amplifier circuits, each of which is provided for each pair of the plurality of said bit line pairs and amplifies a potential difference between said first and second bit lines;

a pair of data lines having a first data line coupled to the plurality of said first bit lines and a second data line coupled to the plurality of said second bit lines;

a first switch circuit, provided between the plurality of said bit line differential amplifier circuits of each pair of the plurality of pairs of said bit lines and said pair of data lines, for turning on and off a charge transmission from each of said bit line pairs to said data line pair;

a data line differential amplifier circuit for amplifying the potential difference between said data line pair;

an equalizer connected between the first and second data lines to selectively equalize the data line pair at an equalization potential; and an amplitude limiting circuit consisting of an N channel metal oxide semiconductor (NMOS) transistor which has a source electrode directly connected to one of said first and second data lines, a drain electrode directly connected to the other of said first and second data lines, and a gate electrode having a gate potential set such that the NMOS transistor is conductive when the potential difference between said first and second data lines becomes a predetermined regulated value while the data line differential amplifier circuit is activated, thereby limiting an amplitude between said first and second data lines to less than said predetermined regulated value by conduction of said transistor, wherein the gate potential of the NMOS transistor is set such that the amplitude limiting operation of the amplitude limiting circuit is not synchronized with the equalization operation of the equalizer.

107. A semiconductor integrated circuit for reading data in memory cells comprising:

a memory cell matrix having memory cells arranged in a plurality of rows and a plurality of columns along two directions which are at right angles to each other;

a plurality of word lines each arranged at one row of said cell matrix;

a plurality of bit line pairs which have a pair of bit lines arranged at each column of said cell matrix, and each pair of which has a first and a second bit line for reading said data;

a plurality of bit line differential amplifier circuits, each of which is provided for each pair of the plurality of said bit line pairs and amplifies a potential difference between said first and second bit lines;

a pair of data lines having a first data line connected to the plurality of said first bit lines and a second data line connected to the plurality of said second bit lines;

a first switch circuit, provided between the plurality of said bit line differential amplifier circuits of each pair of the plurality of pairs of said bit lines and said pair of data lines;

a data line differential amplifier circuit for amplifying the potential difference between said data line pair and for generating complimentary signals having a first signal and a second signal;

an equalizer connected between the first and second data lines to selectively equalize the data line pair at an equalization potential; and an amplitude limiting circuit consisting of an N channel metal oxide semiconductor (NMOS) transistor which has a source electrode directly connected to one of said first and second data lines, a drain electrode directly connected to the other of said first and second data lines, and a gate electrode having a gate potential set such that the NMOS transistor is conductive when the potential difference between said first and second data line becomes a predetermined regulated value while the data line differential amplifier circuit is activated, said amplitude limiting circuit limiting an amplitude between said first and second data lines to less than said predetermined regulated value, said predetermined regulated value being smaller than a voltage difference between said first and second signals, wherein the gate potential of the NMOS transistor is set such that the amplitude limiting operation of the amplitude limiting circuit is not synchronized with the equalization operation of the equalizer.

108. A semiconductor integrated circuit comprising:

at least one memory cell having a first transistor of a first conductive type having a gate, a source and a drain, the memory cell further having a capacitor connected between the source of the first transistor of the first conductive type and a power source;

a word line connected to the gate of the first transistor of the first conductive type;

at least one bit line pair, the pair having a first and a second bit line, the first bit line connected to the drain of the first transistor of the first conductive type;

a first and second data line;

at least one first pair of transistors of the first conductive type connected in series to each other and connected to the bit lines;

at least one first pair of transistors of a second conductive type connected in series to each other and connected to the bit lines and to the first transistor pair of the first conductive type to form a bit line differential amplifier that amplifies a potential difference between the bit lines;

at least one second pair of transistors of the first conductive type, one of the transistors in the second transistor pair of the first conductive type having a source connected to the first bit line and a drain connected to the first data line, the other of the transistors in the second transistor pair of the first conductive type having a source connected to the second bit line and a drain connected to the second data line, the second transistor pair of the first conductive type having gates connected to each other to which a first control signal is applied, the second transistor pair of the first conductive type, in response to the first control signal, transferring the potential difference between the bit lines amplified by the differential amplifier to the data lines;

a second transistor of the first conductive type having a drain connected to the first data line, a source connected to the second data line and a gate to which a second control signal is applied, wherein the second transistor of the first conductive type forms an amplitude limiting circuit, and in response to the second control signal, maintains the potential difference between the data lines at a threshold level of the second transistor or more; and a second pair of transistors of the second conductive type having sources connected to the power source, a drain of one of the second pair of transistors of the second conductive type being connected to the first data line and a drain of the other of the second transistor pair of the second conductive type being connected to the second data line, and gates of the second transistor pair of the second conductive type being supplied a third control signal, and a second transistor of the second conductive type having a source connected to the first data line, a drain connected to the second data line, and a gate to which the third control signal is applied, wherein the second transistor pair of the second conductive type and the second transistor of the second conductive type, in response to the third control signal, equalizes the data lines by charging and equalizing the data lines to a predetermined potential, wherein the second control signal is different from and is not synchronized with the third control signal.

109. A semiconductor integrated circuit comprising:

a memory cell array having a plurality of memory cells operating at a power source potential;

a plurality of bit line pairs, each having a first and a second bit line and connected to one of the memory cells;

a first and a second data line connected to the first and second bit lines, respectively, via a differential amplifier;

a limiting circuit consisting of one metal oxide semiconductor (MOS) transistor, responsive to a first control signal, for keeping a potential difference between the data lines induced by the differential amplifier at a threshold level of the MOS transistor or more but lower than the power source potential, the limiting circuit operating while the differential amplifier is activated; and means, responsive to a second control signal, for equalizing the data lines, wherein the first control signal is different from and is not synchronized with the second control signal.

110. A semiconductor integrated circuit comprising:

at least one memory cell operating at a power source potential;

at least one bit line differential amplifier connected to the memory cell via a bit line pair, the bit line differential amplifier generating a first potential difference by amplifying a first potential difference on the bit line pair;

a first switch connected to the differential amplifier via the bit line pair, the first switch transferring the amplified first potential difference to a data line pair;

a limiting circuit consisting of an N channel metal oxide semiconductor (NMOS) transistor having a source directly connected to one of the data line pair, a drain directly connected to the other of the data line pair, and a gate to which a control signal is applied, said limiting circuit limiting a second potential difference ($V_2$) between the data line pair to a threshold level ($V_{th}$) of the NMOS transistor or more but lower than the power source potential ($V_{th} \leq V_2 < V_{cc}$);

a second switch connected to the limiting circuit via the data line pair, the second potential difference being transferred via the second switch; and an equalizer connected to the second switch via the data line pair, the equalizer equalizing the data line pair by charging to the power source potential the data line pair, wherein the control signal is set such that he limiting operation of the limiting circuit is not synchronized with the equalization operation of the equalizer.

111. A dynamic random access memory having a plurality of memory cells, data stored in one of the memory cells being amplified and transferred from a bit line pair to a data line pair, the dynamic random access memory comprising:

an amplitude limiting circuit consisting of an N channel metal oxide semiconductor (NMOS) transistor having a source directly connected to one of the data line pair, a drain directly connected to the other of the data line pair and a gate to which a first control signal is applied, the NMOS transistor keeping a potential difference between the data lines at a threshold level of the NMOS transistor or more in response to the first control signal; and first, second, and third P channel metal oxide semiconductor (PMOS) transistors, the first and second PMOS transistors having sources connected to a power source, a drain of the first PMOS transistor being connected to one of the data line pair and a drain of the second PMOS transistor being connected to the other of the data line pair, the source of the third PMOS transistor being connected to one of the data line pair and the drain of the third PMOS transistor being connected to the other of the data line pair, the first, second, and third PMOS transistors equalizing the data line pair at a potential supplied by the power source, wherein the first control signal is set such that the amplitude limiting circuit operates to limit the potential difference between the data lines during at least part of an active operating cycle of the dynamic random access memory, and the first control signal is set such that the amplitude limiting operation of the amplitude limiting circuit is not synchronized with the equalization operation of the first, second, and third PMOS transistors.

112. In a semiconductor memory device of the type having:

a plurality of memory cells, a plurality of bit line pairs, each having a first and a second bit line, either the first or the second bit line, or both the first and second bit lines being connected to one of the memory cells, a plurality of differential amplifiers connected between the first and second bit lines, a first and a second data line selectively coupled to the first and second bit lines via coupling means, and equalizing means, responsive to a first control signal, for equalizing the data lines by charging the data lines to a predetermined potential, the improvement which comprises:

an amplitude limiting circuit consisting of one transistor having a current path and a control electrode, the current path of the transistor being directly connected between the first and second data lines, and the control electrode of the transistor receiving a second control signal, for limiting a potential difference between the first and second data lines to a threshold level of the transistor or more in response to the second control signal, wherein the first control signal is different from and is not synchronized with the second control signal.

113. A semiconductor memory device comprising:

a memory cell matrix having:
    a plurality of memory cells arranged in matrix;
    a plurality of word lines, each word line being connected to a row of memory cells in the memory cell matrix; and
    a plurality of bit line pairs each having a first bit line and a second bit line, each bit line pair being connected to a column of memory cells from the memory cell matrix;

a first data line pair having a first data line and a second data line, the first bit lines of the bit line pairs being selectively coupled to the first data line and the second bit lines of the bit line pairs being selectively coupled to the second data line;

a first means for precharging the first and the second data lines to a first potential (V);

a first N channel field effect transistor (NFET) directly connected between the first and the second data lines, the first NFET having a threshold voltage (Vth) and including a gate electrode; and a second means for supplying a second potential to the gate electrode of the first NFET for making the first NFET conductive, the second potential being a maximum voltage level ($\phi1_{max}$) that is less than the sum of the first potential and the threshold voltage of the first NFET ($\phi1_{max}<V+Vth$), wherein a period during which the second means supplies the second potential to the first NFET is not the same as a period during which the first means precharges the first and second data lines.

114. A method for controlling a semiconductor memory, the semiconductor memory of the type having:

a memory cell matrix including a plurality of memory cells arranged in matrix, word lines each connected to a row of memory cells in the memory cell matrix, and bit line pairs each connected to a column of memory cells in the memory cell matrix;

a first data line pair having a first data line and a second data line, the bit line pairs being selectively coupled to the first data line pair;

a precharging circuit; and a first N channel field effect transistor (NFET) directly connected between the first and the second data lines, the first NFET having a threshold voltage (Vth), the method comprising the steps of:

precharging the first and the second data lines to a first potential (V); and supplying a second potential ($\phi1_{max}$) to a gate electrode of the first NFET for making the first NFET conductive at least while the first data line pair is being sensed, the second potential being less than the sum of the first potential and the threshold voltage of the first NFET ($\phi1_{max}<V+Vth$), wherein a period during which the second potential is supplied to the gate electrode of the first NFET is not the same as a period during which the first and second data lines are precharged.

115. A semiconductor memory device comprising:

a memory cell matrix including:
    a plurality of memory cells arranged in matrix; and
    a plurality of bit line pairs, each bit line pair being connected to memory cells from the memory cell matrix;

a first data line pair having a first data line and a second data line, the bit line pairs being selectively coupled to the first data line pair;

a precharging means for precharging and equalizing the first and the second data lines to a first potential (V); and a limiting circuit consisting of one limiting transistor directly connected between the first data line and the second data line, the limiting transistor having a threshold voltage (Vth) and a gate electrode, wherein a control signal is supplied to the gate electrode of the limiting transistor, one of the bit line pairs is coupled to the first data line pair during an output period of a memory read cycle, the control signal is held at a second potential ($\phi1_{max}$) during the entire output period to keep the limiting circuit activated during the entire output period, thereby limiting the potential difference between the first data line and the second data line to the threshold voltage of the limiting transistor or more during the output period, and a period during which the control signal is held at the second potential is not the same as a period during which the precharging means precharges and equalizes the first and second data lines.

\* \* \* \* \*